United States Patent
Jung et al.

(10) Patent No.: US 9,450,025 B2
(45) Date of Patent: Sep. 20, 2016

(54) RESISTIVE MEMORY DEVICE AND METHOD OF OPERATING RESISTIVE MEMORY DEVICE

(71) Applicants: Seung-Jae Jung, Gyeonggi-Do (KR); Youn-Seon Kang, Yongin-Si (KR); Jung-Dal Choi, Hwaseong-Si (KR)

(72) Inventors: Seung-Jae Jung, Gyeonggi-Do (KR); Youn-Seon Kang, Yongin-Si (KR); Jung-Dal Choi, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/736,525

(22) Filed: Jun. 11, 2015

(65) Prior Publication Data

US 2016/0049447 A1  Feb. 18, 2016

(30) Foreign Application Priority Data

Aug. 14, 2014  (KR) ........................ 10-2014-0106222

(51) Int. Cl.
  *H01L 27/24*  (2006.01)
  *H01L 45/00*  (2006.01)
  *H01L 27/22*  (2006.01)

(52) U.S. Cl.
  CPC ......... *H01L 27/2463* (2013.01); *H01L 27/224* (2013.01); *H01L 27/2409* (2013.01); *H01L 27/2418* (2013.01); *H01L 27/2481* (2013.01); *H01L 45/04* (2013.01); *H01L 45/06* (2013.01); *H01L 45/1233* (2013.01); *H01L 45/144* (2013.01); *H01L 45/146* (2013.01); *H01L 45/1675* (2013.01)

(58) Field of Classification Search
  CPC .................................................. H01L 27/2481
  See application file for complete search history.

(56) References Cited

U.S. PATENT DOCUMENTS

| | | | |
|---|---|---|---|
| 6,329,666 B1 | 12/2001 | Doan et al. | |
| 6,635,546 B1 | 10/2003 | Ning | |
| 7,420,198 B2 | 9/2008 | Baek et al. | |
| 7,682,904 B2 | 3/2010 | Kim et al. | |
| 7,935,950 B2 | 5/2011 | Doan et al. | |
| 8,008,149 B2 | 8/2011 | Kuniya | |
| 8,129,705 B2 | 3/2012 | Kinoshita et al. | |
| 8,163,593 B2 | 4/2012 | Raghuram et al. | |

(Continued)

FOREIGN PATENT DOCUMENTS

JP  2011-029462  2/2011

OTHER PUBLICATIONS

Liu, Tz-Yi et al., "A 130.7mm2 2-Layer 32GB ReRAM Memory Device in 24mn Technology," ISSCC 2013/Session 12/Nonvolatile Memory Solutions/12.1.

*Primary Examiner* — Stephen W Smoot
(74) *Attorney, Agent, or Firm* — Volentine & Whitt, PLLC

(57) ABSTRACT

A resistive memory device includes a plurality of memory cell pillars arranged in a line in one direction and each having a memory layer and a top electrode layer connected to the memory layer, a top conductive line having a plurality of protrusions extending downwardly and between which pockets in the bottom of the top conductive line are defined, and a plurality of insulating pillars. The protrusions of the top conductive line face and are electrically connected to the memory cell pillars, respectively, so as to be electrically connected to the memory layer through the top electrode layer of the memory cell pillar. The insulating pillars extend from insulating spaces, between side wall surfaces of the memory layers and top electrode layers of the memory cell pillars, into the pockets in the bottom of the top conductive line.

13 Claims, 35 Drawing Sheets

(56) References Cited

U.S. PATENT DOCUMENTS 8,351,244 B2 1/2013 Okada et al.
2011/0186797 A1* 8/2011 Herner ................. G11C 17/16
 257/2
2013/0161716 A1 6/2013 Kim et al.

* cited by examiner

US 9,450,025 B2

RESISTIVE MEMORY DEVICE AND METHOD OF OPERATING RESISTIVE MEMORY DEVICE

PRIORITY STATEMENT

This application claims the benefit of Korean Patent Application No. 10-2014-0106222, filed on Aug. 14, 2014, in the Korean Intellectual Property Office, the disclosure of which is hereby incorporated by reference in its entirety.

BACKGROUND

The inventive concept relates to a resistive memory device and to a method of operating the resistive memory device, and more particularly, to a resistive memory device having a 3-dimensional (3D) cross-point structure and to a method of operating the resistive memory device.

Resistive memory devices switched between two different resistance states according to an external stimulus applied to a resistive layer have been recently proposed. A 3-dimensional (3D) cross-point structure in which a memory cell is disposed at a crossing point between two crossing electrodes is also proposed to highly integrate a resistive memory device. As there is a continuous demand for down-scaling of the resistive memory device having the 3D cross-point structure, a thickness reduction of all layers of the resistive memory device including electrodes has gradually increased, resulting in a phenomenon in which a resistive layer and a conductive line contact each other. Thus, a resistive memory device having a 3D cross-point structure may have issues of reliability.

SUMMARY

According to an aspect of the inventive concept, there is provided a resistive memory device including: a plurality of memory cell pillars spaced in a line in one direction and each comprising a memory layer and a top electrode layer electrically connected to the memory layer, a top conductive line having protrusions at its bottom and pockets in its bottom, and in which the pockets are defined by and between the protrusions in said one direction such that the pockets and protrusions are alternately disposed along said one direction, whereby the top conductive line has an uneven bottom surface, the protrusions are connected to the memory cell pillars at tops of the memory pillars, respectively, and each of the protrusions is electrically connected to the memory layer of a respective one of the memory cell pillars through the top electrode layer of the memory cell pillar, and a plurality of insulating pillars occupying insulating spaces defined by side surfaces of the memory layer and side surfaces of the top electrode layer and respectively extending into the pockets in the bottom of the top conductive line.

According to another aspect of the inventive concept, there is provided a resistive memory device including: a plurality of first conductive lines extending parallel to each other in one direction, a plurality of second conductive lines extending parallel to each other in another direction crossing the one direction with the plurality of first conductive lines and the plurality of second conductive lines being vertically juxtaposed so as to cross one another at a plurality of locations, a plurality of memory cell pillars interposed between the plurality of first conductive lines and the plurality of second conductive lines at the locations where the plurality of first conductive lines and the plurality of second conductive lines cross one another, whereby the memory cell pillars are arrayed in horizontal columns each extending in said one direction and horizontal rows each extending in said another direction, and a plurality of insulating pillars interposed between the memory cell pillars in the columns of memory cell pillars, and in which each of the insulating pillars is interposed between adjacent ones the memory pillars in a respective column of the memory cell pillars, each of the insulating pillars has an extension protruding in a vertical direction beyond the adjacent ones of the memory cell pillars, each of the second conductive lines has protrusions at its bottom and pockets in its bottom, the pockets are defined by and between the protrusions in said one direction such that the pockets and protrusions are alternately disposed along said one direction, whereby each of the second conductive lines has an uneven bottom surface, the protrusions at the bottom of each of the second conductive lines respectively face the memory cell pillars of a respective one of the columns of the memory pillars, and the pockets in the bottom of each of the second conductive lines each accommodate the extension of a respective one of the insulating pillars.

According to another aspect of the inventive concept, there is provided a resistive memory device including: a plurality of first conductive lines extending parallel to each other in a first direction, a plurality of second conductive lines extending parallel to each other in a second direction crossing the first direction with the plurality of first conductive lines and the plurality of second conductive lines being vertically juxtaposed so as to cross one another at a plurality of first locations, a plurality of third conductive lines extending parallel to each other in a third direction crossing the second direction with the plurality of second conductive lines and the plurality of third conductive lines being vertically juxtaposed so as to cross one another at a plurality of second locations, a plurality of first level memory cell pillars interposed between the plurality of first conductive lines and the plurality of second conductive lines at the locations where the plurality of first conductive lines and the plurality of second conductive lines cross one another, whereby the first level memory cell pillars are arrayed in horizontal columns each extending in said first direction and horizontal rows each extending in said second direction, a plurality of second level memory cell pillars interposed between the plurality of second conductive lines and the plurality of third conductive lines at the locations where the plurality of second conductive lines and the plurality of third conductive lines cross one another, whereby the second level memory cell pillars are arrayed in horizontal rows each extending in said second direction and horizontal columns each extending in said third direction, and a plurality of first level insulating pillars interposed between the first level memory cell pillars in the columns of the first level memory cell pillars, and in which each of the first level insulating pillars is interposed between adjacent ones the first level memory pillars in a respective column of the first memory cell pillars, each of the first level memory pillars has an extension portion protruding in a vertical direction beyond adjacent ones of the first level memory cell pillars, each of the second conductive lines has protrusions at its bottom and pockets in its bottom, the pockets are defined by and between the protrusions in said second direction such that the pockets and protrusions are alternately disposed along said second direction, whereby each of the second conductive lines has an uneven bottom surface, the protrusions at the bottom of each of the second conductive lines respectively face the first level memory cell pillars of a respective one of the columns of the first level memory pillars, and the pockets in the bottom of each of the second conductive lines each accommodate the extension of a respective one of the first level insulating pillars.

According to another aspect of the inventive concept, there is provided a resistive memory device including: a substrate, a top conductive line extending in a lengthwise direction over the substrate, memory cell pillars interposed between the substrate and the top conductive line, and interlayer insulation between the substrate and the top conductive line and electrically insulating the memory cell pillars from one another in a region of the device between the substrate and the top conductive line, and in which the top conductive line has downwardly extending protrusions spaced from each other in the lengthwise direction, and a downwardly open pocket delimited by and between the protrusions, the memory cell pillars are spaced from each other in the lengthwise direction and are vertically aligned with the protrusions of the top conductive line, respectively, each of the memory cell pillars comprises a variable resistor and a top electrode interposed between the variable resistor and a respective one of the downwardly extending protrusions the top conductive line, and the interlayer insulation extends around the variable resistor and the top electrode of each of the memory cell pillars and into the pocket in the top conductive line such that the insulation projects from a location between the memory cell pillars upwardly beyond the level of an uppermost surface of the top electrode of each of the memory cell pillars.

According to another aspect of the inventive concept, there is provided a method of manufacturing a resistive memory device including: forming a first conductive layer on a substrate; forming a stack structure for forming a memory cell on the first conductive layer, the stack structure including a preliminary memory layer and a preliminary top electrode layer; forming a plurality of first conductive lines and a plurality of stack lines spaced apart from each other and extending parallel to each other with a plurality of first gaps disposed therebetween by patterning the stack structure and the first conductive layer; forming a plurality of gap-fill insulting lines filling the plurality of first gaps and having top surfaces protruding from levels of top surfaces of the plurality of stack lines away from the substrate; forming a second conductive layer on the plurality of stack lines and on the plurality of gap-fill insulating lines; and patterning the second conductive layer, the plurality of stack lines, and the plurality of gap-fill insulating lines to form a plurality of second conductive lines extending parallel to each other in a direction crossing the plurality of first conductive lines and having uneven surfaces, the uneven surfaces including a plurality of connection protrusion portions and a plurality of pocket portions, form a plurality of memory cell pillars disposed at a plurality of crossing points between the plurality of first conductive lines and the plurality of second conductive lines and connected to the plurality of connection protrusion portions, and form a plurality of insulating pillars disposed between a first column of memory cell pillars arranged in a line in an extension direction of the plurality of second conductive lines among the plurality of memory cell pillars and including extension portions accommodated in the plurality of pocket portions.

According to another aspect of the inventive concept, there is provided a method of manufacturing a resistive memory device including forming a first conductive layer on a substrate; forming a stack structure for forming a memory cell on the first conductive layer; forming a sacrificial film on the stack structure; forming a plurality of first conductive lines, a plurality of stack lines for the memory cell, and a plurality of sacrificial lines extending parallel to each other by patterning the sacrificial film, the stack structure, and the first conductive layer; forming a plurality of gap-fill insulting lines filling between the plurality of first conductive lines, between the plurality of memory cell forming stack lines, and between the plurality of sacrificial lines; exposing top surfaces of the plurality of stack lines for forming the memory cell by removing the plurality of sacrificial lines; and forming a second conductive line having uneven surfaces, the uneven surfaces including a plurality of connection protrusion portions facing top surfaces of the plurality of stack lines for forming the memory cell and a plurality of pocket portions defined by the plurality of connection protrusion portions and accommodating the plurality of gap-fill insulating lines.

According to another aspect of the inventive concept, there is provided a method of manufacturing a resistive memory device including forming a plurality of first conductive lines extending parallel to each other on a substrate; forming a plurality of second conductive lines extending parallel to each other in a direction crossing the plurality of first conductive lines at locations spaced apart from the plurality of first conductive lines and including uneven surfaces including a plurality of connection protrusion portions and a plurality of pocket portions; forming a plurality of memory cell pillars disposed at a plurality of crossing points between the plurality of first conductive lines and the plurality of second conductive lines and connected to the plurality of connection protrusion portions; and forming a plurality of insulating pillars extending to the plurality of pocket portions from a plurality of insulating spaces defined by side walls of the plurality of memory cell pillars between the plurality of memory cell pillars.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE PREFERRED EMBODIMENTS

Figure 1A:
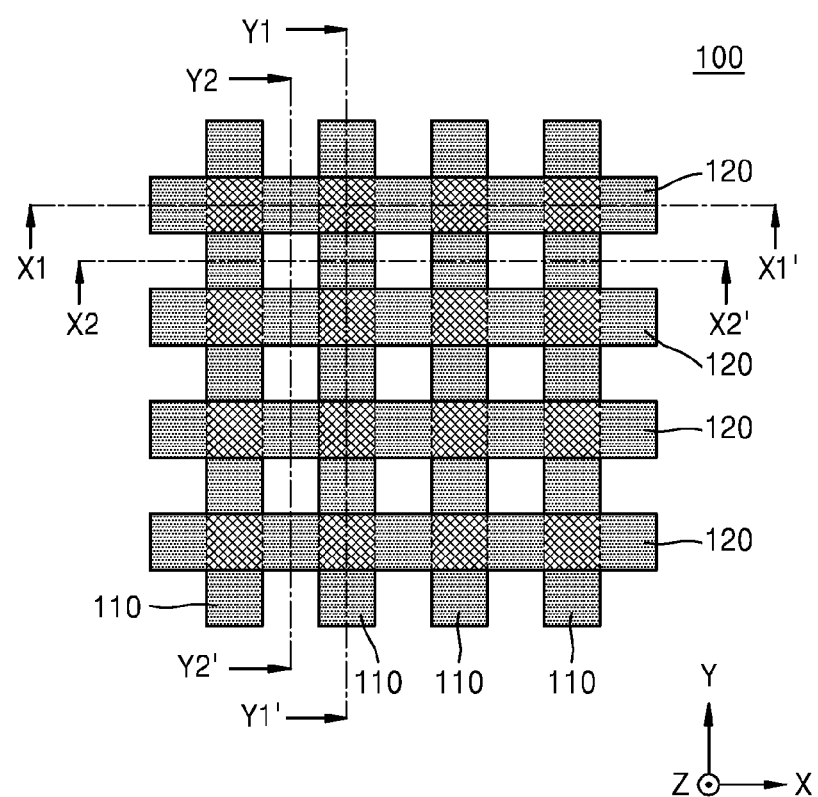
FIG. 1A is a plane layout diagram schematically showing essential parts of a resistive memory device.

Hereinafter, the inventive concept will be described in detail by explaining exemplary embodiments of the invention with reference to the attached drawings. Like reference numerals in the drawings denote like elements, and thus their description will be omitted.

The inventive concept may, however, be embodied in many different forms and should not be construed as limited to the exemplary embodiments set forth herein. Rather, these embodiments are provided so that this disclosure will be thorough and complete, and will fully convey the scope of the inventive concept to those skilled in the art. In the drawings, lengths and sizes of layers and regions may be exaggerated for clarity.

Also, though terms like 'first' and 'second' are used to describe various elements, components, regions, layers, and/or portions in various embodiments of the inventive concept, the elements, components, regions, layers, and/or portions should not be limited by these terms. These terms are only used to distinguish one element, component, region, layer, or portion from another. Thus, a first element, component, region, layer or section discussed below could be termed a second element, component, region, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

When a certain embodiment can be embodied in a different manner, a specified process order may be performed in a different manner in order to be described. For example, two processes to be described sequentially may be substantially performed at the same time or may be performed in an order opposite to the order to be described.

As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1B:
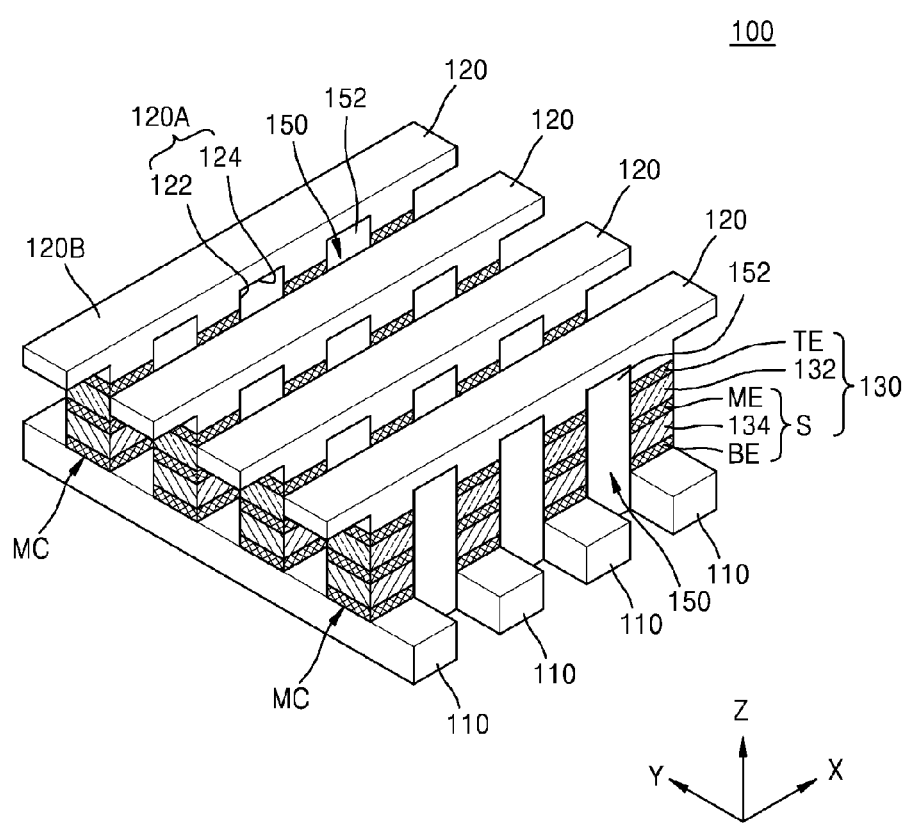
FIG. 1B is a perspective view of the essential parts of the resistive memory device of FIG. 1A, according to embodiments of the inventive concept.

FIG. 1A is a plane layout diagram schematically showing essential parts of a resistive memory device 100, and FIG. 1B is a perspective view of the essential parts of the resistive memory device 100 of FIG. 1A, according to embodiments of the inventive concept.

FIGS. 2A through 2D are cross-sectional views schematically showing the essential parts of the resistive memory device 100 taken along lines X1-X1', X2-X2', Y1-Y1', and Y2-Y2' of FIG. 1A, respectively, according to embodiments of the inventive concept.

The resistive memory device 100 according to embodiments of the inventive concept will now be described in detail with reference to FIGS. 1A through 2D.

The resistive memory device 100 includes a plurality of first conductive lines 110 extending parallel to each other in a first direction (for example, Y direction) and a plurality of second conductive lines 120 extending parallel to each other in a second direction (for example, X direction) crossing the first direction.

The first and second directions are the Y and X directions, respectively, so that the first and second directions cross each other in the present embodiment but are not limited to the directions of FIGS. 1A through 2D.

Each of the plurality of first conductive lines 110 and the plurality of second conductive lines 120 may include a plurality of word lines or a plurality of bit lines. In an example, the plurality of first conductive lines 110 may be the plurality of word lines, and the plurality of second conductive lines 120 may be the plurality of bit lines. In another example, the plurality of first conductive lines 110 may be the plurality of bit lines, and the plurality of second conductive lines 120 may be the plurality of word lines.

Each of the plurality of first conductive lines 110 and the plurality of second conductive lines 120 may be formed of metal, a conductive metal nitride, a conductive metal oxide, or a combination of these. In some embodiments, the plurality of first conductive lines 110 and the plurality of second conductive lines 120 may be formed of W, WN, Au, Ag, Cu, Al, TiAlN, Ir, Pt, Pd, Ru, Zr, Rh, Ni, Co, Cr, Sn, Zn, ITO, an alloy of these, or a combination of these. In some other embodiments, each of the plurality of first conductive lines 110 and the plurality of second conductive lines 120 may include a metal film and a conductive barrier film covering at least a part of the metal film. The conductive barrier film may be formed of, for example, Ti, TiN, Ta, TaN, or a combination of these but is not limited thereto.

Each of the plurality of first conductive lines 110 and the plurality of second conductive lines 120 may include a plurality of stripe patterns crossing each other. A plurality of memory cells MC (see FIG. 1B) may be formed at each of a plurality of crossing points between the plurality of first conductive lines 110 and the plurality of second conductive lines 120, and may have a cross point array structure.

Each of the plurality of memory cells MC may store digital information. The plurality of memory cells may store digital information according to a phase change between various resistance states including a high resistance state and a low resistance state. Each of the plurality of memory cells may include one or more different material layers.

Figure 2A:
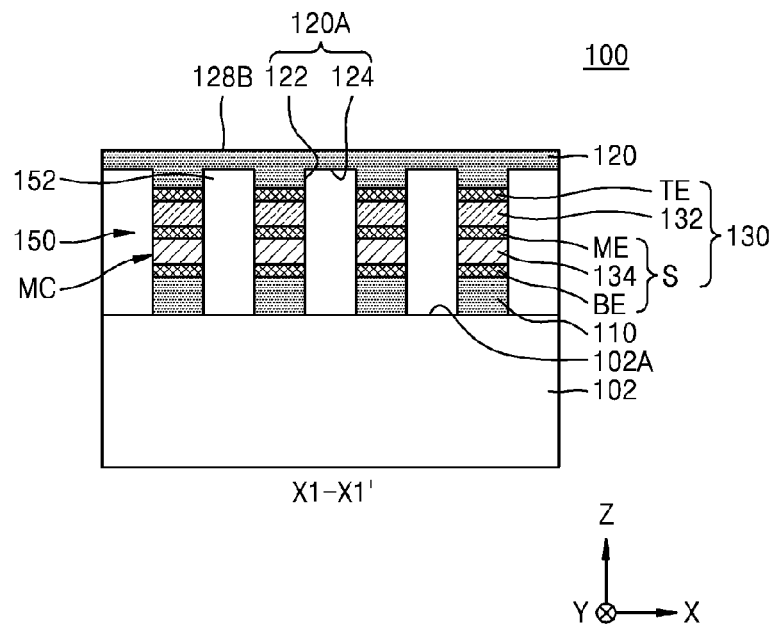
FIGS. 2A, 2B, 2C and 2D are cross-sectional views schematically showing the resistive memory device of FIG. 1A taken along lines X1-X1', X2-X2', Y1-Y1', and Y2-Y2' of FIG. 1A, respectively, according to embodiments of the inventive concept.
Figure 2B:
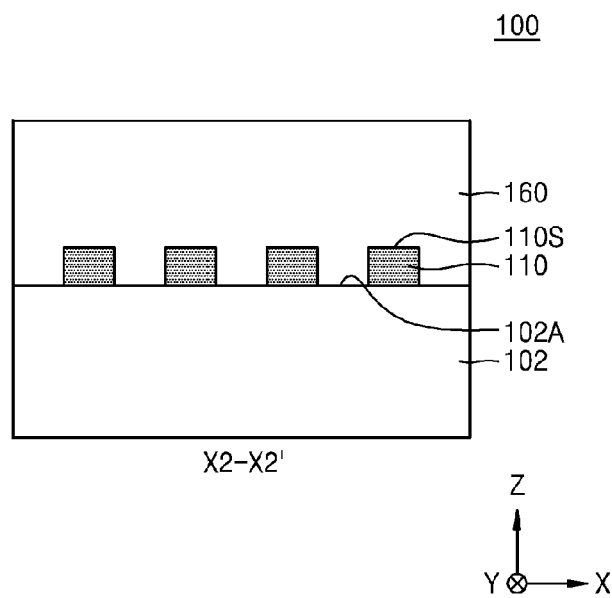
Figure 2C:
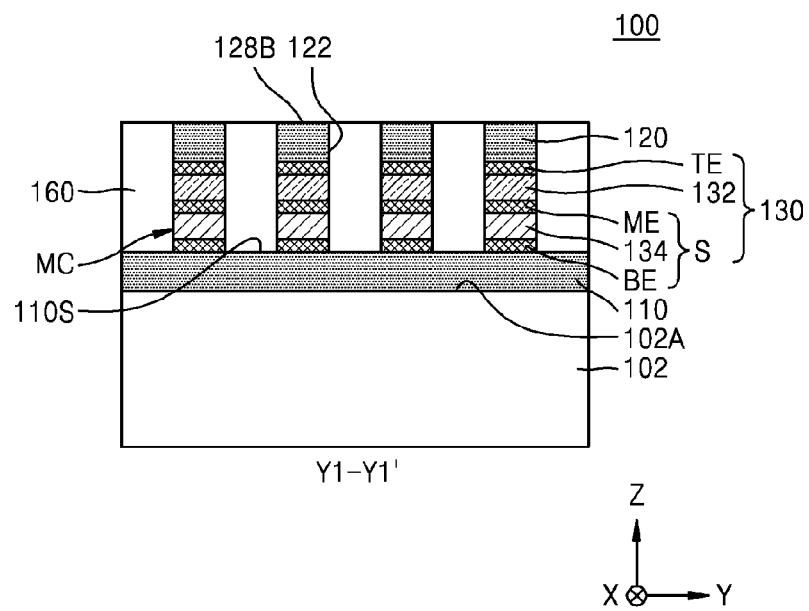

The plurality of memory cells MC may include a plurality of memory cell pillars 130 as shown in FIGS. 1B, 2A, and 2C.

Insulating pillars 150 may be disposed between memory cells pillars 130 that are aligned in the second direction (X direction).

That is, each of the plurality of insulating pillars 150 is disposed between the plurality of memory cells pillars 130 that are aligned in the line in the second direction (X direction). The plurality of insulating pillars 150 may have extension portions 152 extending in a direction (Z direction) perpendicular to the first and second directions to cover side walls of a pair of neighboring memory cell pillars 130 at both sides in the second direction (X direction), and protruding in a direction away from the pair of neighboring memory cell pillars 130.

The plurality of second conductive lines 120 includes uneven first surfaces 120A. The uneven first surfaces 120A include a plurality of connection protrusion portions 122 facing the plurality of memory cell pillars 130, and a plurality of pocket portions 124 that face the extension portions 152 of the plurality of insulating pillars 150. Each of the plurality of connection protrusion portions 122 and each of the plurality of pocket portions 124 are alternately disposed in a length direction (X direction) of the plurality of second conductive lines 120. The plurality of second conductive lines 120 includes second surfaces 120B evenly extending in the length direction (X direction) on sides of second conductive lines 120 opposite those having the uneven first surfaces 120A.

The plurality of connection protrusion portions 122 have approximately rectangular shapes in FIGS. 1B, 2A, and 2C but are not limited thereto. The plurality of connection protrusion portions 122 may have various shapes. For example, the connection protrusion portions 122 may be semicircular, semi-elliptical, trapezoidal, triangular, etc.

The extension portions 152 of the plurality of insulating pillars 150 have approximately rectangular cross-sectional shapes a shown in FIGS. 1B and 2A but are not limited thereto. The extension portions 152 may have various cross-sectional shapes. For example, cross-sectional shapes of the extension portions 152 may be semicircular, semi-elliptical, trapezoidal, triangular, etc.

Top surfaces 110S of the plurality of first conductive lines 110 facing the plurality of memory cell pillars 130 may evenly extend in the first direction (Y direction) but are not limited thereto.

Each of the plurality of memory cell pillars 130 may include a memory layer 132 and a top electrode layer TE connected to the memory layer 132.

The memory layer 132 may include a resistive layer whose resistance changes with changes in an electric field in which the resistive layer is disposed. In an example, when the memory layer 132 contains a transition metal oxide, the resistive memory device 100 may be a resistance RAM (RRAM). In another example, when the memory layer 132 is formed of a phase change material whose resistance changes with changes in its temperature, the resistive memory device 100 may be a phase change RAM (PRAM). In another example, when the memory layer 132 has a magnetic tunnel junction (MTJ) structure including two electrodes formed of a magnetic material and a dielectric material disposed between the two magnetic electrodes, the resistive memory device 100 may be a magnetic RAM (MRAM).

In some embodiments, the memory layer 132 may be formed of various types of compounds. In other some embodiments, the memory layer 132 may be formed of a material including impurities added to various types of compounds. In other embodiments, the memory layer 132 may include a resistive layer and one or more barrier films and/or one or more conductive films that cover at least a part of the resistive layer.

When the memory layer 132 is formed of the transition metal oxide, the transition metal oxide may include at least one metal selected from the group consisting of Ta, Zr, Ti, Hf, Mn, Y, Ni, Co, Zn, Nb, Cu, Fe, and Cr. For example, the transition metal oxide may include a single layer or a multiple layer formed of at least one material selected from the group consisting of $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and $Fe_2O_{3-x}$. In these materials, x and y may be within a range of $0 \leq x \leq 1.5$ and $0 \leq y \leq 0.5$, respectively, but are not limited thereto.

When the memory layer 132 is formed of a phase change material whose resistance changes according to Joule's heat generated by voltages applied to both ends, the phase change material may be GST ($Ge_xSb_yTe_z$), N-doped GST, O-doped GST, $Ge_xTe_yO_x$, $Ge_xSb_y$, or $In_xGe_yTe_z$.

When the memory layer 132 has the MTJ structure, the MTJ structure may include a magnetization pinned layer, a magnetization free layer, and a tunnel barrier disposed between the magnetization pinned layer and the magnetization free layer. The tunnel barrier may be formed of an oxide of one material selected from the group consisting of Mg, Ti, Al, MgZn, and MgB but is not limited thereto.

The top electrode layer TE may be formed of a metal, conductive metal nitride, conductive metal oxide, or a combination of these. For example, the top electrode layer TE may include a TiN film but is not limited thereto. In some embodiments, the upper electrode layer TE may include a conductive film formed of a metal or conductive metal nitride and one or more conductive barrier films covering at least a part of the conductive film. The conductive barrier films may be formed of a metal oxide, a metal nitride, or a combination of these but is not limited thereto.

The top electrode layer TE may be a metal film, one or more barrier films and/or one or more conductive films that cover at least a part of the metal film.

Each of the plurality of memory cell pillars 130 may further include a selection device S. The selection device S may be a current adjustment device that may control a flow of current. In some embodiments, the selection device S may be formed of unidirectional diode or a bidirectional diode but is not limited thereto. The selection device S may be formed of a silicon containing material, a metal transition oxide, or a chalcogenide glass. The selection device S may be a silicon diode, an oxide diode, or a tunneling diode but is not limited thereto.

The selection device S, as shown in FIGS. 1B, 2A, and 2C above, may include a selection device layer 134, a middle electrode layer ME disposed between the selection device layer 134 and the memory layer 132, and a bottom electrode layer BE spaced apart from the middle electrode layer ME with the selection device layer 134 disposed between the bottom electrode layer BE and the middle electrode layer ME.

In some embodiments, the selection device S may have a metal/silicon/metal structure. For example, the selection device layer 134 of the selection device S may be formed of polysilicon, and the bottom electrode layer BE and the middle electrode layer ME thereof may be formed of TiN but are not limited thereto.

In some embodiments, each of the bottom electrode layer BE and the middle electrode layer ME may be formed of a metal, conductive metal nitride, conductive metal oxide, or a combination of these. For example, each of the bottom electrode layer BE and the middle electrode layer ME may include a TiN film but is not limited thereto. In some embodiments, each of the bottom electrode layer BE and the middle electrode layer ME may include a conductive film formed of a metal or conductive metal nitride and one or more conducive barrier films covering at least a part of the conductive film. The conductive barrier films may include a metal oxide, metal nitride, or a combination of these but are not limited thereto.

Each of the plurality of insulating pillars 150 is formed to cover side walls of at least one pair of memory layers 132 and side walls of a pair of top electrode layers TE among the side walls of the pair of neighboring memory cell pillars 130 at both sides in the second direction (X direction).

In some embodiments, the plurality of insulating pillars 150 may include an oxide film, nitride film, or a combination of these. For example, the plurality of insulating pillars 150 may include a silicon oxide, a silicon nitride, or an aluminum oxide. In other some embodiments, at least a part of the plurality of insulating pillars 150 may include an air space.

Figure 2D:
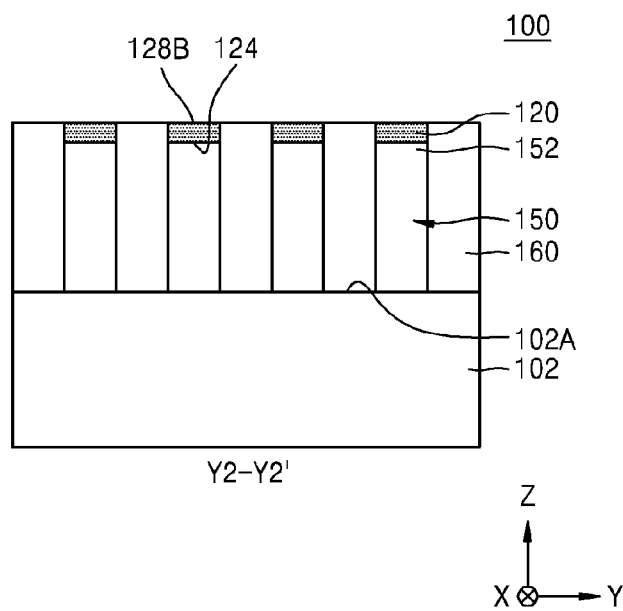

As shown in FIGS. 2B through 2D, insulating lines 160 are arranged to insulate the memory cell pillars 130 from one another in the first direction (Y direction).

Each of the plurality of insulating lines 160 is disposed between respective ones of the memory cell pillars 130 arranged in a line in the first direction (Y direction). The plurality of insulating lines 160 extend parallel to each other in the lengthwise direction X of the uneven surfaces 120A of the plurality of second conductive lines 120.

The second conductive lines 120 and the insulting lines 160 are alternately arranged in the first direction (Y direction) in the resistive memory device 100.

In some embodiments, the plurality of insulating lines 160 may be formed of an oxide film, nitride film, or a combination of these. For example, the plurality of insulating lines 160 may include a silicon oxide, silicon nitride, or aluminum oxide. In other some embodiments, at least a part of the plurality of insulating lines 160 may include the air space.

The plurality of first conductive lines 110, the plurality of second conductive lines 120, and the plurality of memory cell pillars 130 may be provided on a substrate 102.

A main surface 102A of the substrate 102 may be parallel to an X-Y plane. The plurality of memory cell pillars 130 and the plurality of insulating pillars 150 may extend on the substrate 102 in the direction (Z direction) perpendicular to the main surface 102A of the substrate 102.

The substrate 102 may include a semiconductor wafer. In some embodiments, the substrate 102 may comprise a semiconductor material such as Si or Ge, or a compound semiconductor such as SiC, GaAs, InAs, or InP. In other embodiments, the substrate 102 may have a silicon on insulator (SOI) structure. For example, the substrate 102 may include a buried oxide layer (BOX) layer. In some embodiments, the substrate 102 may include a conductive area, for example, a well doped with impurities or a structure doped with impurities.

Although not shown, a structure including a plurality of gates, at least one interlayer insulating film, a plurality of contacts, a plurality of wires, etc., may be disposed between the substrate 102 and the plurality of first conductive lines 110.

Figure 3:
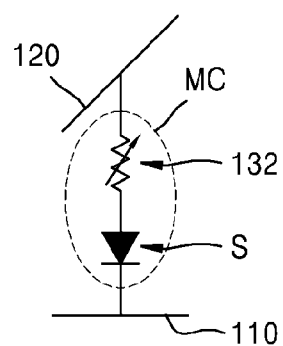
FIG. 3 is an equivalent circuit diagram of a plurality of memory cells of a resistive memory device, according to an embodiment of the inventive concept.

FIG. 3 is an equivalent circuit diagram of one of the plurality of memory cells MC of the resistive memory device 100 of FIGS. 1A through 2D, according to an embodiment of the inventive concept.

Referring to FIG. 3, the memory cell MC includes the memory layer 132 for storing information and the selection device S for selecting the memory cells MC. FIG. 3 shows a case where the selection device S is a diode.

One end of the memory layer 132 may be connected to the second conductive line 120 and another end thereof may be connected to an anode of the diode. A cathode of the diode may be connected to the first conductive line 110.

As shown in FIGS. 1A through 2D, the selection device S (diode in the example of FIG. 3) may be disposed between the memory layer 132 and the first conductive line 110 in the plurality of memory cell pillars 130 of the plurality of memory cells MC. Accordingly, the substrate 102 may be closer to the selection device S than the memory layer 132. However, the inventive concept is not limited to FIGS. 1A through 2D. For example, the selection device S may be disposed between the second conducive lines 120 and the memory layer 132 among the plurality of memory cell pillars 130 such that the substrate 102 may be closer to the memory layer 132 than the selection device S.

In the resistive memory device 10 of FIGS. 1A through 2D, a voltage is applied to the memory layer 132 of one selected from the plurality of memory cells MC through the plurality of first conductive lines 110 and the plurality of second conductive lines 120, and thus current may flow through the memory layer 132. The memory layer 132 may be reversibly transited between first and second states. For example, the voltage applied to the memory layer 132 changes according to a combination of electric potentials applied to the plurality of first conductive lines 110 and the plurality of second conductive lines 120, and resistance of the memory layer 132 may be reversibly transited between the first and second states. Accordingly, digital information such as "0" or "1" may be stored in or erased from the memory cell MC. For example, data "0" may be determined as written in the memory cell MC when the memory cell is placed in a high resistance state, and data "1" may be determined as written in the memory cell MC when the memory cell is placed in a low resistance state. In this regard, a write operation from the high resistance state to the low resistance state may be referred to as a "set operation", and a write operation from the low resistance state to the high resistance state may be referred to as a "reset operation". However, the memory cell MC according to the inventive concept is not limited to providing/facilitating only these states/operations of data storage but may provide/ facilitate various other resistance states/operations of data storage.

The memory cells MC may be addressed according to which of the plurality of first conductive lines 110 and the plurality of second conductive lines 120 are selected, i.e., a predetermined signal may be applied between select ones of the selected plurality of first conductive lines 110 and the plurality of second conductive lines 120. As a result, the memory cells MC may be programmed. Furthermore, current flow may be measured through the bit lines (either the plurality of first conductive lines 110 or the plurality of second conductive lines 120), and thus information may be read according to resistance values of the variable resistive material of the corresponding (selected) memory cells MC.

Figure 4:
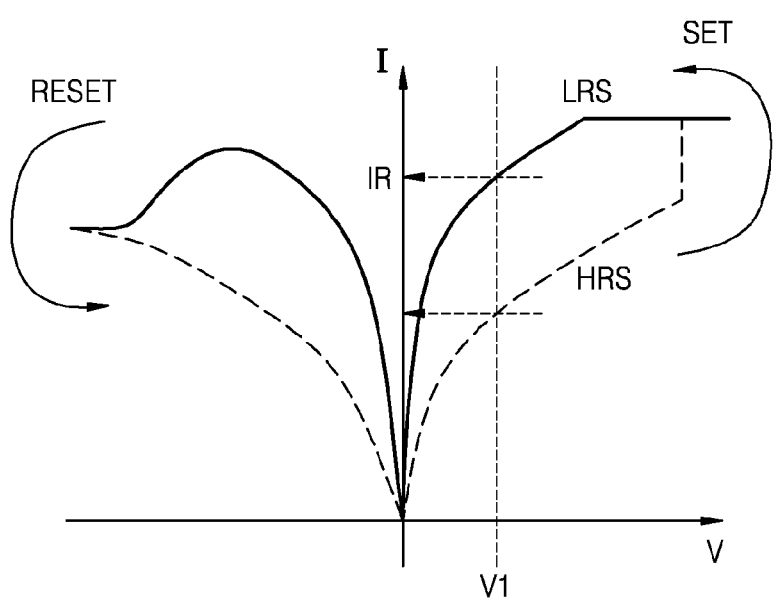
FIG. 4 is a graph illustrating exemplary current and voltage characteristics of a resistive memory device, according to an embodiment of the inventive concept.

FIG. 4 is a graph illustrating exemplary current and voltage characteristics of the resistive memory device 100, according to an embodiment of the inventive concept.

Referring to FIG. 4, the resistive memory device 100 may switch, in a set operation, from a high resistance state HRS to a low resistance state LRS as the magnitude of the voltage in a first reference direction increases, for example, as a positive voltage increases. The resistive memory device 100 may switch, in a reset operation, from the low resistance state LRS to the high resistance state HRS as the magnitude of the voltage in a direction opposite to the first reference direction increases, for example, as a negative voltage increases.

The low resistance state LRS or the high resistance state HRS of the resistive memory device 100 may be read by detecting a read current IR at a predetermined voltage, for example, a voltage V1. As described above, the resistive memory device 100 may store on/off digital information "1" and "0" as the low resistance state and the high resistance state, respectively.

Figure 5A:
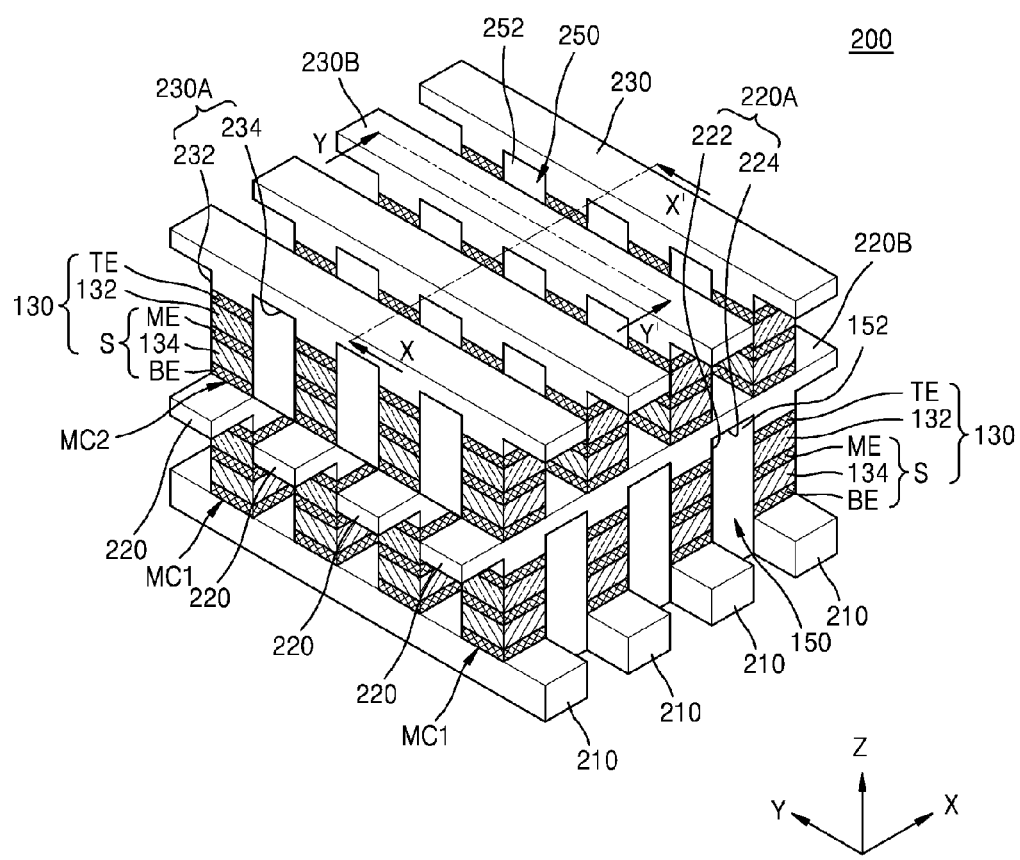
FIG. 5A is a perspective view schematically showing essential parts of a resistive memory device, according to another embodiment of the inventive concept.
Figure 5B:
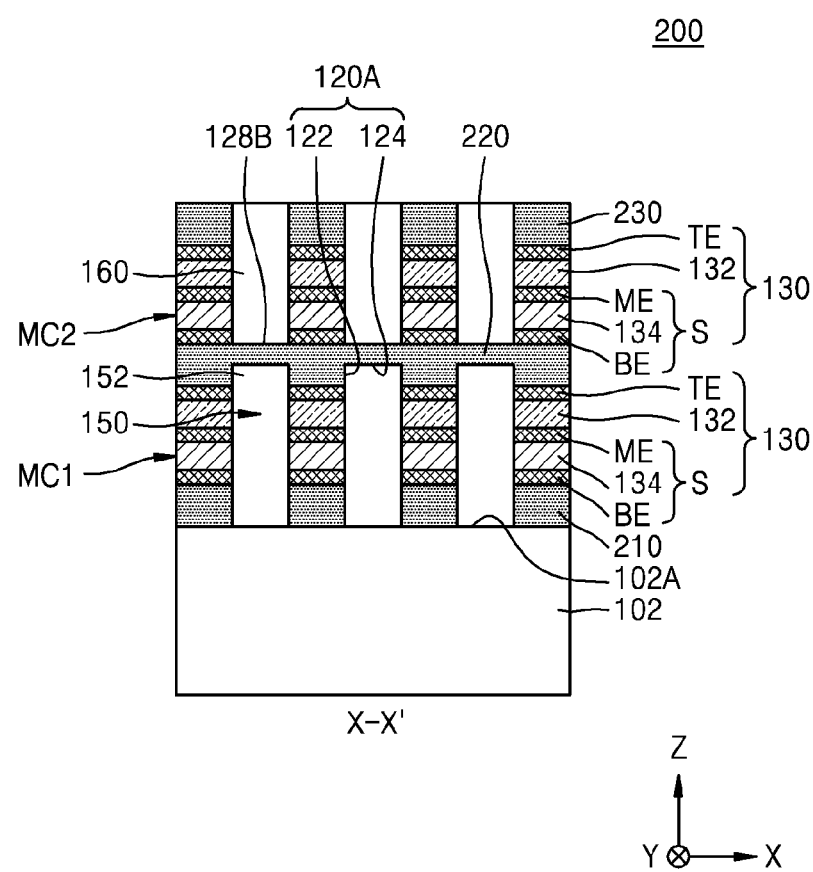
FIG. 5B is a cross-sectional view taken along a line X-X' of FIG. 5A.
Figure 5C:
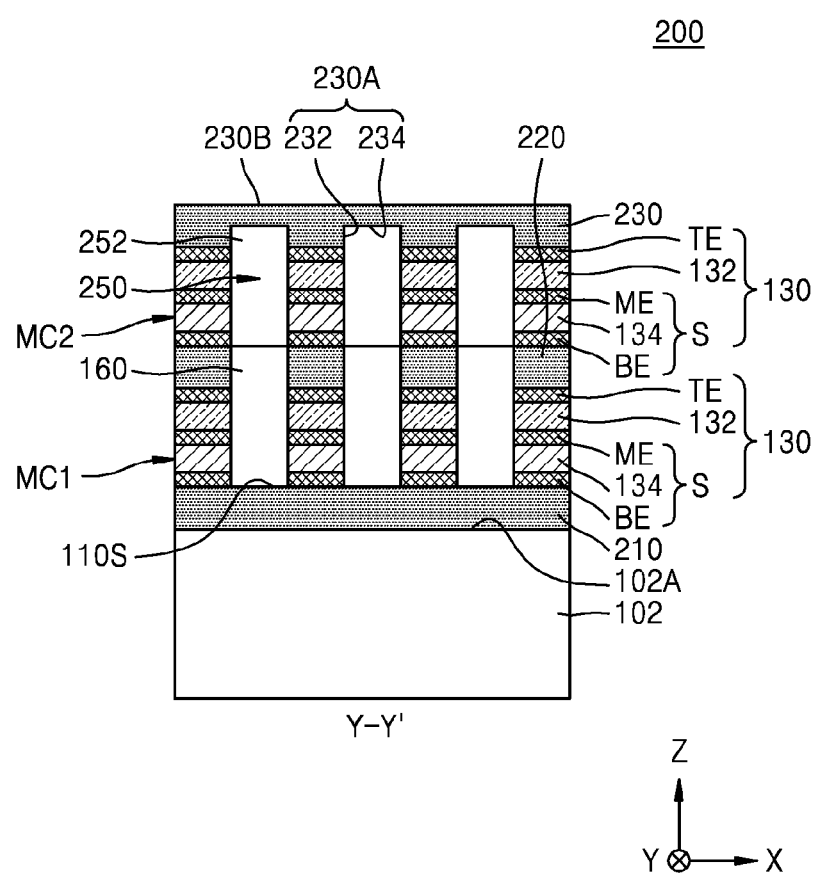
FIG. 5C is a cross-sectional view taken along a line Y-Y' of FIG. 5A.

FIG. 5A is a perspective view schematically showing essential parts of a resistive memory device 200, according to another embodiment of the inventive concept. FIG. 5B is a cross-sectional view taken along a line X-X' of FIG. 5A. FIG. 5C is a cross-sectional view taken along a line Y-Y' of FIG. 5A.

Figure 6:
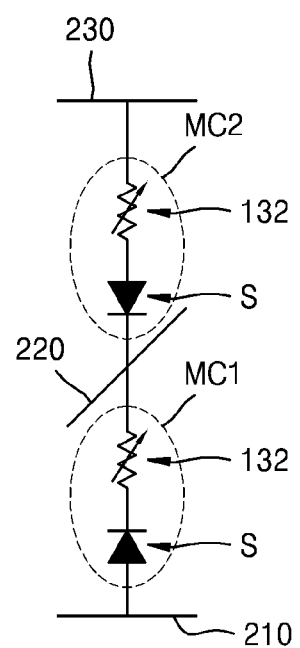
FIG. 6 is an equivalent circuit diagram of a plurality of memory cells of the resistive memory device 200 of FIGS. 5A through 5C, according to another embodiment of the inventive concept.

FIG. 6 is an equivalent circuit diagram of memory cells MC1 and MC2 of the resistive memory device 200 of FIGS. 5A through 5C, according to another embodiment of the inventive concept.

Like reference numerals in FIGS. 5A through 5C and 6 and FIGS. 1A through 3 denote like elements, and thus the like elements will not be described here again in detail.

Referring to FIGS. 5A through 5C and 6, the resistive memory device 200 includes a plurality of first conductive lines 210 extending parallel to each other in a first direction (Y direction), a plurality of second conductive lines 220 extending parallel to each other in a second direction (X direction) crossing the first direction, and a plurality of third conductive lines 230 extending parallel to each other in a third direction (Y direction) crossing the second direction.

The plurality of first conductive lines 210 and the plurality of third conductive lines 230 extend parallel to each other, and extend in a direction perpendicular to the lengthwise direction of the plurality of second conductive lines 220 in the present embodiment but are not limited to FIGS. 5A through 5C.

The plurality of first memory cells MC1 are disposed at a plurality of crossing points between the plurality of first conductive lines 210 and the plurality of second conductive lines 220. The plurality of first memory cells MC1 may have the same configuration as that of the plurality of memory cell pillars 130 described with reference to FIGS. 1A through 2D.

The insulating pillars 150 may be disposed between the first memory cells MC1 in the second direction (X direction). That is, each of the plurality of insulating pillars 150 is disposed between adjacent ones of first memory cells MC1 aligned in the second direction (X direction), and may have the extension portions 152 protruding upwardly beyond the plurality of first memory cells MC1.

The plurality of second conductive lines 220 includes uneven first surfaces 220A. The uneven first surfaces 220A include a plurality of connection protrusions 222 facing the plurality of first memory cells MC1, and a plurality of pocket portions 224 that accommodate the extension portions 152 of the plurality of insulating pillars 150. Each of the plurality of connection protrusions 222 and each of the plurality of pocket portions 224 are alternately disposed in the lengthwise direction of the second conductive lines 220. The plurality of second conductive lines 220 includes second surfaces 220B evenly extending in the lengthwise direction (X direction) on an opposite side of the conductive lines 220 from the uneven first surfaces 220A.

The plurality of second memory cells MC2 are disposed at a plurality of crossing points between the plurality of second conductive lines 220 and the plurality of third conductive lines 230. The plurality of second memory cells MC2 may have the same configuration as that of the plurality of memory cell pillars 130 described with reference to FIGS. 1A through 2D.

A plurality of insulating pillars 250 may be disposed between the second memory cells MC2 that are aligned in the first direction (Y direction). Each of the plurality of insulating pillars 250 is disposed between adjacent ones of the second memory cells MC2 that are aligned in the first direction (Y direction), and may have extension portions 252 protruding upward beyond the plurality of second memory cells MC2. The insulating pillars 250 and protrusions 252 are similar to the insulating pillars 150 and the protrusions 152 described with reference to FIGS. 1A through 2D.

The plurality of third conductive lines 230 includes uneven first surfaces 230A. The uneven first surfaces 230A include a plurality of connection protrusions 232 facing the plurality of second memory cells MC2, and a plurality of pocket portions 234 accommodating the extension portions 252 of the plurality of insulating pillars 250. The connection protrusions 232 and the pocket portions 234 are alternately disposed in the lengthwise direction of the third conductive lines 230. The plurality of third conductive lines 230 includes second surfaces 230B evenly extending in the lengthwise direction (Y direction) on an opposite side of the third conductive lines 230 from the uneven first surfaces 23s0A.

Each of the plurality of first conductive lines 210, the plurality of second conductive lines 220, and the plurality of third conductive lines 230 may be a plurality of word lines or a plurality of bit lines. In an example, each of the plurality of second conductive lines 220 and the plurality of third conductive lines 230 may be a plurality of bit lines, and each of the plurality of second conductive lines 220 may be a common word line. In another example, each of the plurality of second conductive lines 220 and the plurality of third conductive lines 230 may be a plurality of word lines, and each of the plurality of second conductive lines 220 may be a common bit line.

Each of the plurality of first conductive lines 210, the plurality of second conductive lines 220, and the plurality of third conductive lines 230 may be formed of metal, a conductive metal nitride, a conductive metal oxide, or a combination of these. Materials of the plurality of first conductive lines 210, the plurality of second conductive lines 220, and the plurality of third conductive lines 230 may be similar to those of the plurality of first conductive lines 210 and the plurality of second conductive lines 220 described with reference to FIGS. 1A through 2D.

Figure 7:
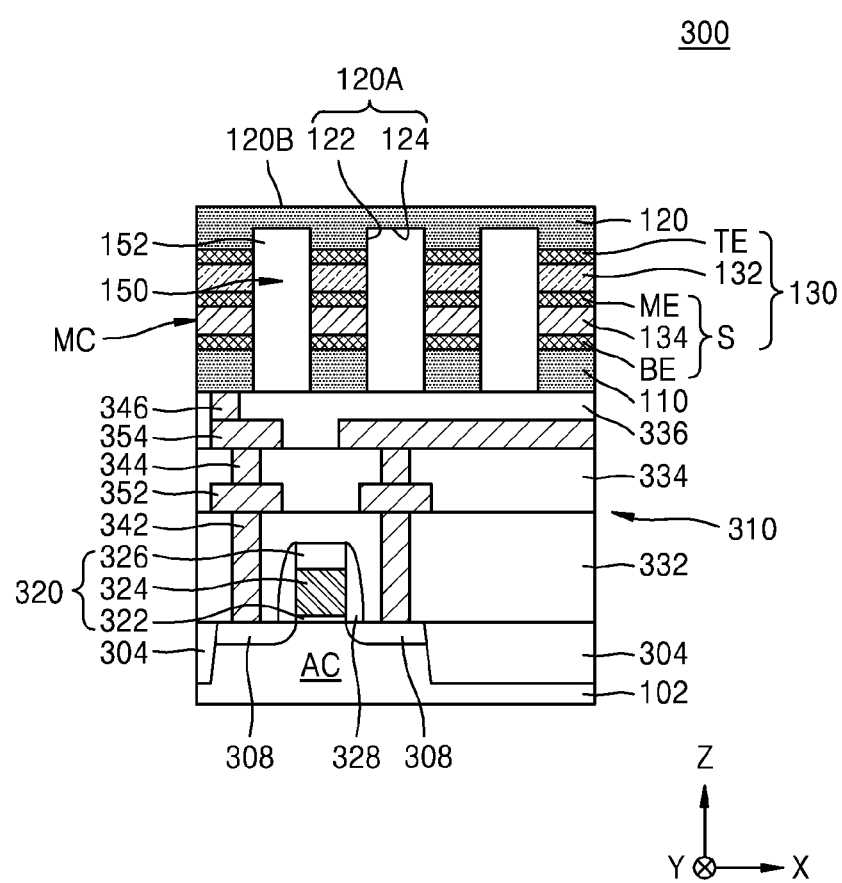
FIG. 7 is a cross-sectional view schematically showing essential parts of a resistive memory device, according to another embodiment of the inventive concept.

FIG. 7 is a cross-sectional view schematically showing essential parts of a resistive memory device 300, according to another embodiment of the inventive concept. Like reference numerals between FIG. 7 and FIGS. 1A through 6 denote like elements, and thus the like elements will not be described here again in detail.

In addition to the essential parts of the resistive memory device 100 described with reference to FIGS. 1A through 2D, the resistive memory device 300 includes a lower structure 310 including a transistor and a plurality of wires between the substrate 102 and the first conductive lines 110. However, an integrated circuit device of the inventive concept is not limited to that shown in FIG. 7.

Referring to FIG. 7, a device isolation area 304 defining an active area AC may be formed in the substrate 102. The lower structure 310 may include a gate structure 320 formed in the active area AC of the substrate 102, a plurality of interlayer insulating films 332, 334, and 336, a plurality of contact plugs 342, 344, and 346, and a plurality of wires 352 and 354.

The gate structure 320 may include a gate insulating film 322, a gate 324, and an insulating capping layer 326 sequentially formed on the active area AC of the substrate 102. Both sides of the gate structure 320 are covered by a gate spacer 328. The gate insulating film 322 may comprise a silicon oxide or a metal oxide. The gate 324 may comprise polysilicon doped with impurities, metal, a metal nitride, or a combination of these. The insulating capping layer 326 may be formed of a nitride film. The gate spacer 328 may be formed of an oxide film, nitride film, or a combination of these.

A pair of impurity areas 308 may be formed at both sides of the gate structure 320 in the active area AC of the substrate 102. In some embodiments, the pair of impurity areas 308 may include N or P type impurities. The gate structure 320 may be configured as an NMOS or PMOS transistor according to the type of impurities in the pair of impurity areas 308.

The wires 352 may be electrically connected to the impurity areas 308 through a contact plug 342 that passes through the interlayer insulating film 332 covering the gate structure 320. The wires 354 may be electrically connected to the wires 352 through a contact plug 344 that passes through the interlayer insulating film 334 covering the wires 352.

The wires 354 may be covered by the interlayer insulating film 336 on which the resistive memory device 300 is formed. The contact plug 346 is formed to pass through the interlayer insulating film 336 covering the wires 354. The first conductive lines 110 of the resistive memory device 100 may be electrically connected to the wires 354 through the contact plug 346.

The plurality of interlayer insulating films 332, 334, and 336 may be formed of a nitride film. The plurality of contact plugs 342, 344, and 346, and the plurality of wires 352 and 354 may be formed of metal, a conductive metal nitride, or a combination of these. For example, the metal may be selected from the group consisting of W, Al, Cu, and Ti.

The resistive memory device 300 may include the essential parts of the resistive memory device 200 of FIGS. 5A through 5C, instead of the essential parts of the resistive memory device 100. The resistive memory device 300 may include modified versions of the resistive memory devices 100 and 200 within the scope of the inventive concept instead of the essential parts of the resistive memory device 100.

The lower structure 310 of FIG. 7 is merely an example, and various other forms thereof are within the scope of the inventive concept. For example, the lower structure 310 may include a single layer wire structure or a three or more multiple layer wire structure.

In the resistive memory devices 100, 200, and 300 of the inventive concept described with reference to FIGS. 1A through 7, and using resistive memory device 100 as an example, the memory layer 132 at least of the memory cells MC have a cross-point array structure and sides of the top electrode layer TE connected to the memory layer 132 at an upper portion of the memory layer 132 are covered by the plurality of insulating pillars 150. To this end, each of the plurality of insulating pillars 150 is disposed between adjacent ones of the first memory cell pillars 130 that are aligned in the second direction (X direction). The plurality of insulating pillars 150 may have the extension portions 152 extending in the perpendicular direction (Z direction) to ensure that the pillars 150 cover opposing sides of neighboring memory cell pillars 130, i.e., the insulating pillars 150 protrude in the perpendicular (Z direction) beyond the neighboring memory cell pillars 130. The plurality of second conductive lines 120 includes the uneven first surfaces 120A including the pocket portions 124 delimiting pockets whose shapes are complementary to those of the extension portions 152 of the plurality of insulating pillars 150, respectively. The uneven first surfaces 120A may include the plurality of connection protrusion portions 122 facing the plurality of memory cell pillars 130.

The uneven first surface 120A of the second conductive lines 120 also allows the level of a top surface of the top electrode layer TE covering the memory cell pillars 130 to be lower than the levels of the top surface of the insulating pillar 150. That is, the distance from the substrate 102 to the top surface of the top electrode layer TE may be smaller than that from the substrate 102 to the top surfaces of the plurality of insulating pillars 150 surrounding the top electrode layer TE with a plurality of insulating lines 160.

Down-scaling of resistive memory devices similar to those described above entails reducing the size of the memory cell pillars and spaces therebetween. Accordingly, thicknesses of electrodes of the memory cell pillars, for example, a bottom electrode layer, middle electrode layer, and top electrode layer have been gradually reduced. However, one particular problem associated as a result of such down-scaling, as will be described in more detail below, is that a resistance switching characteristic of the device degrades because the top electrode layer becomes too thin.

Figure 8A:
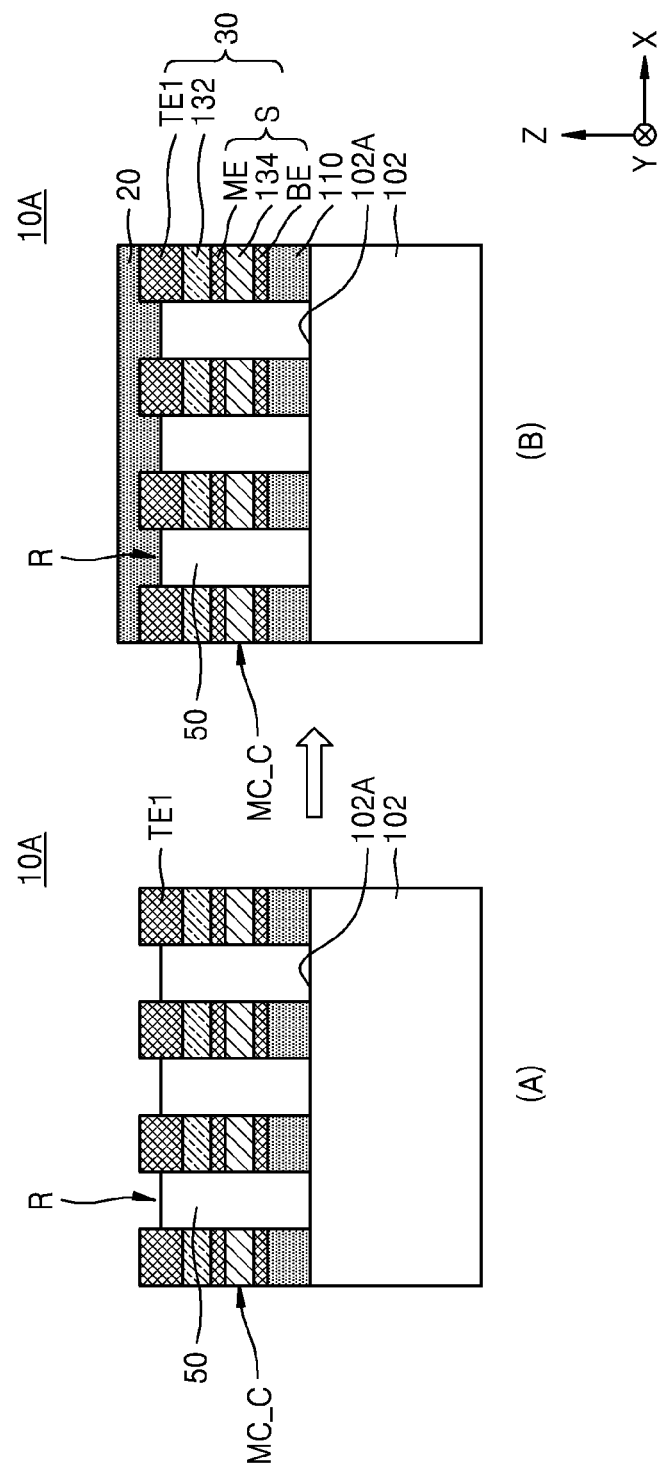
FIGS. 8A, 8B and 8C are cross-sectional views sequentially showing a gradual thickness reduction of top electrode layers of memory cell pillars when down-scaling is performed on resistive memory devices according to a comparative example.
Figure 8B:
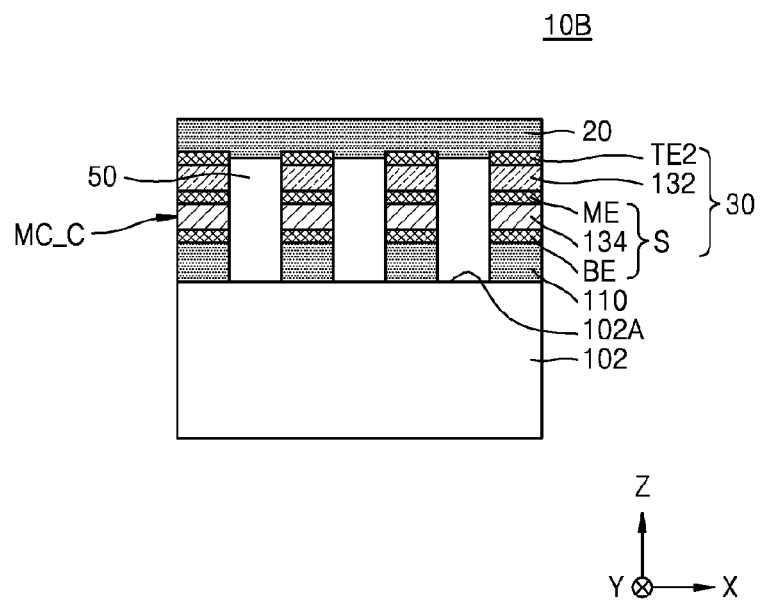
Figure 8C:
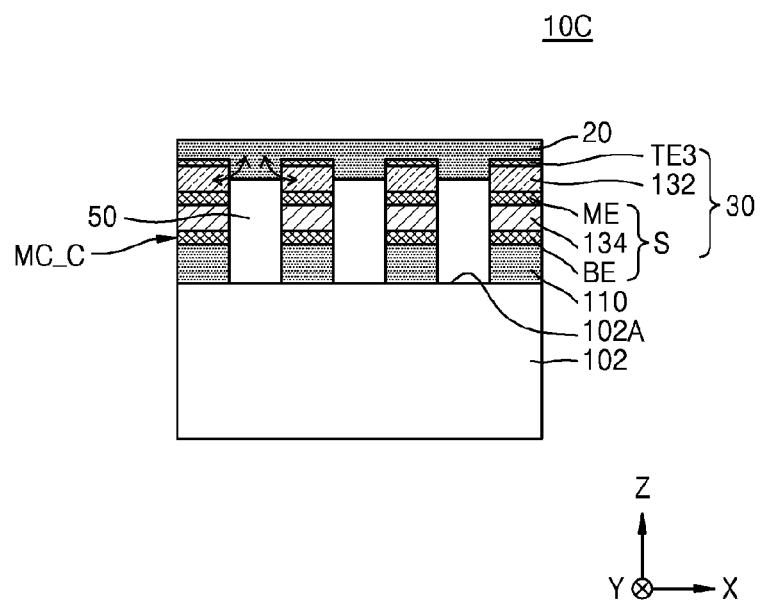

FIGS. 8A through 8C are cross-sectional views sequentially showing a gradual thickness reduction of top electrode layers TE1, TE2, and TE3 of memory cell pillars 30 when down-scaling is performed on comparative examples of resistive memory devices 10A, 10B, and 10C, so as to illustrate the problems due to reductions in the thicknesses of the top electrode layers TE1, TE2, and TE3.

The resistive memory devices 10A, 10B, and 10C of the comparative examples of FIGS. 8A through 8C have generally the same structure as that of the resistive memory device 100 of the inventive concept described with reference to FIGS. 1A through 2D, except that top surfaces of gap-fill insulating films 50 surrounding the top electrode layers TE1, TE2, and TE3 of the memory cell pillars 30 of memory cells MC_C are situated at levels lower than those of the top electrode layers TE1, TE2, and TE3.

The resistive memory device 10A of the comparative example of FIG. 8A has a resultant intermediate structure A after spaces between the memory cell pillars 30 are filled with the gap-fill insulating films 50 and before second electrode line 20 is formed. As shown in the resultant A, levels of top surfaces of the gap-fill insulting films 50 are lower than those of top surfaces of the top electrode layers TE1.

When the gap-fill insulating films 50 insufficiently cover the sides of the top electrode layers TE1, TE2, and TE3 in the resistive memory devices 10A, 10B, and 10C of the comparative examples, for example, when the top surfaces of the gap-fill insulating films 50 are disposed at levels lower than those of the top electrode layers TE1, TE2, and TE3, before the second electrode line 20 is formed, recesses R (see FIG. 8A) exist around the top electrode layers TE1, TE2, and TE3. If the second conductive line 20 is formed on the resultant A, as shown in B of FIG. 8A, the recesses R are filled with the second conductive line 20. Scaling down the resistive memory device 10A results in a gradual reduction in the thickness of the top electrode TE1, yielding top electrode layer TE2 of resistive memory device 10B as shown in FIG. 8B, and ultimately top electrode TE3 of resistive memory device 10C as shown in FIG. 8C.

As a result of this down-scaling, conductive material deposited to form the second conductive line 20 undesirably comes into contact with the memory layer 132 beneath the top electrode layer TE. Thus, as shown by bidirectional arrows of FIG. 8C, the second conductive line 20 and the memory layer 132 are shorted so that current does not pass through the top electrode layer TE between the second conductive line 20 and the memory layer 132 but flows directly therebetween. When the current flows between the second conductive line 20 and the memory layer 132 without passing through the top electrode layer TE, a resistive switching characteristic of the memory cell pillars 30 may not be effected.

On the other hand, the resistive memory devices 100, 200, and 300 according to the inventive concept include the plurality of insulating pillars 150 including the extension portions 152 protruding in a vertical direction upward beyond the memory cell pillars 130, so that sides of the memory layer 132 and sides of the top electrode layer TE may be covered by the plurality of insulating pillars 150 in the memory cells MC having a cross point array structure.

Figure 9A:
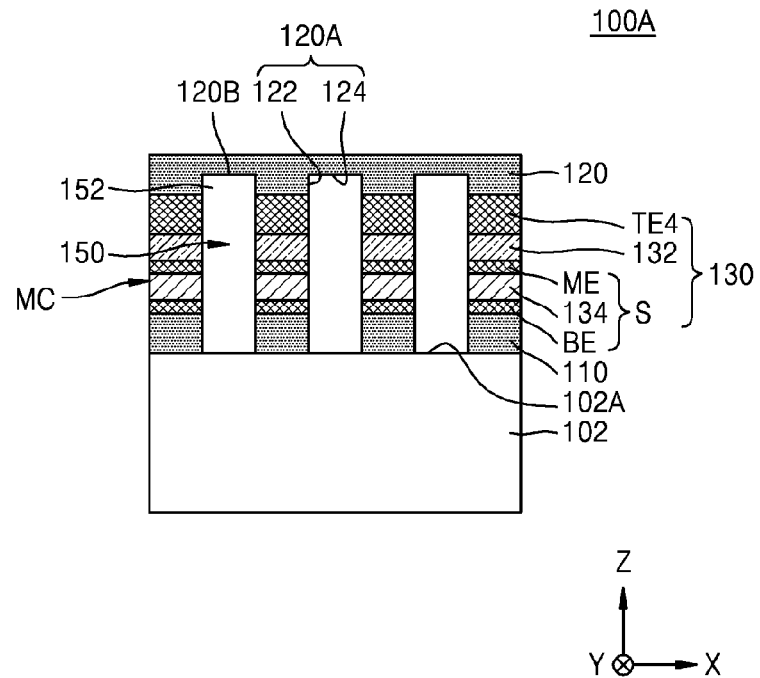
FIGS. 9A, 9B and 9C are cross-sectional views for explaining an insulation effect obtained by a plurality of insulating pillars when thicknesses of top electrode layers of resistive memory devices are gradually reduced by performing down-scaling on a resistive memory device, according to embodiments of the inventive concept.
Figure 9B:
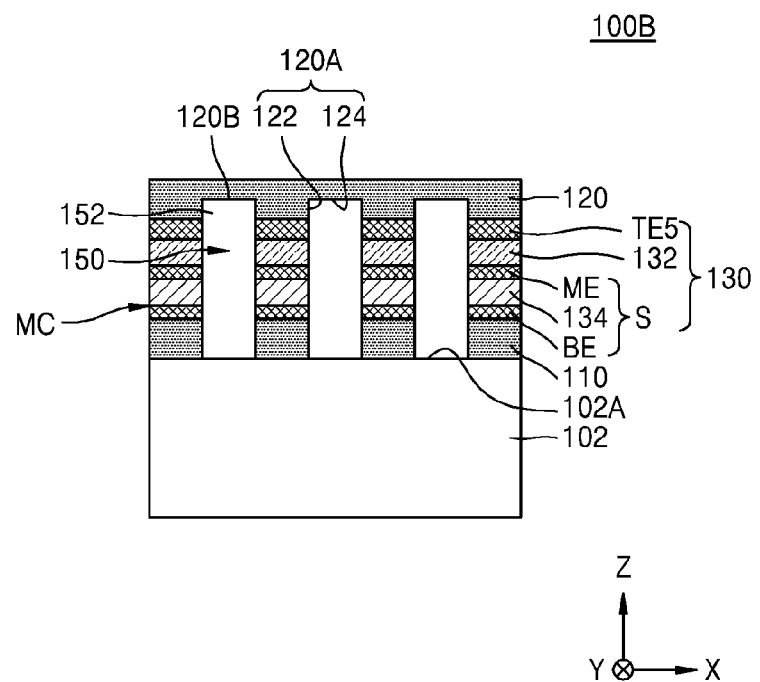
Figure 9C:
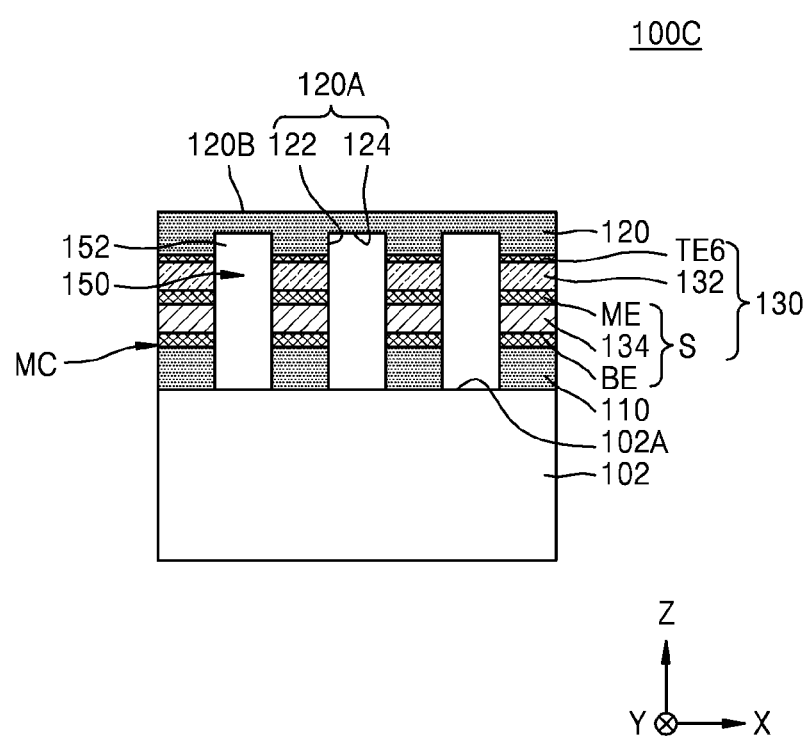

FIGS. 9A through 9C are cross-sectional views showing progressively thinner top electrode layers TE4, TE5, and TE6 of memory cell pillars 130 of memory cells MC of resistive memory devices 100A, 100B, and 100C, illustrating how a down-scaling of the resistive memory device 100 according to the inventive concept does not create the problems described above.

Referring to FIGS. 9A through 9C, when the thicknesses of the top electrode layers TE4, TE5, and TE6 of the memory cell pillars 130 are gradually reduced by down-scaling, the plurality of insulating pillars 150 including the protruding extension portions 152 have top surfaces that can remain at a higher level than that of top surfaces of the top electrode layers TE4, TE5, and TE6. Thus there is no concern that the second conductive line 120 and the memory layer 132 or a portion of the memory cell pillar 130 beneath the memory layer 132 are shorted. Thus, even as the thicknesses of the top electrode layers are gradually reduced, a current flow path that passes through the top electrode layers TE4, TE5, and TE6 between the second conductive line 120 and the memory layer 132 is guaranteed, such that the memory cell pillars 130 retain an excellent resistance switching characteristic.

FIGS. 10A through 10K are cross-sectional views showing a method of manufacturing a resistive semiconductor device 400, according to embodiments of the inventive concept.

The resistive semiconductor device 400 (see FIG. 10K) has a structure similar to that of the resistive semiconductor device 100 of FIGS. 1A through 2D. Like reference numerals in FIGS. 10A through 10K and FIGS. 1A through 2D denote like elements, and thus the like elements will not be described here again in detail.

Figure 10A:
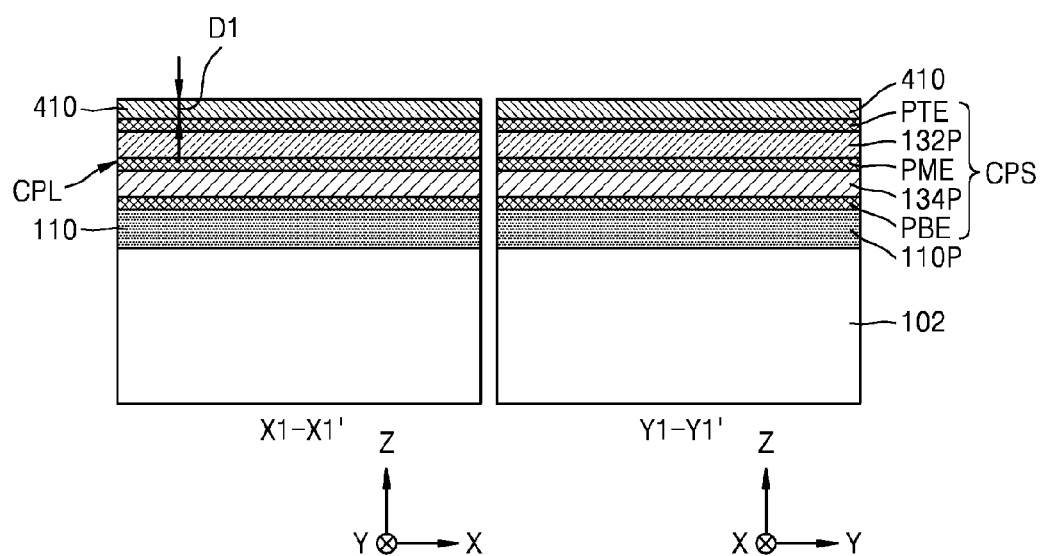
FIGS. 10A, 10B, 10C, 10D, 10E, 10F, 10G, 10H, 10I, 10J and 10K are cross-sectional views sequentially showing a method of manufacturing a resistive semiconductor device according to embodiments of the inventive concept, each taken in directions corresponding to directions along lines X1-X1' and Y1-Y1 of FIG. 1A.

Referring to FIG. 10A, a first conductive layer 110P is formed on the substrate 102, and a cross point array forming stack structure CPS including a preliminary bottom electrode layer PBE, preliminary selection device layer 134P, preliminary middle electrode layer PME, preliminary memory layer 132P, and preliminary top electrode layer PTE are sequentially stacked on the first conductive layer 110P.

Thereafter, a sacrificial film 410 is formed on the stack structure CPS.

A thickness D1 of the sacrificial film 410 may be determined in consideration of thicknesses of the protrusion portions 122 (see FIGS. 1A through 2D) of the uneven first surfaces 120A of the second conductive lines 120 that are to be finally formed and an amount of the sacrificial film 410 consumed to perform a subsequent process. The sacrificial film 410 may be formed of a silicon nitride film but is not limited thereto.

The first conductive layer 110P may be formed of metal, a conductive metal nitride, a conductive metal oxide, or a combination of these. In some embodiments, the first conductive layer 110P may be formed of W, WN, Au, Ag, Cu, Al, TiAlN, Ir, Pt, Pd, Ru, Zr, Rh, Ni, Co, Cr, Sn, Zn, ITO, an alloy of these, or a combination of these. In other embodiments, the first conductive layer 110P may include a metal film and a conductive barrier film covering at least a part of the metal film. The conductive barrier film may be formed of, for example, Ti, TiN, Ta, TaN, or a combination of these but is not limited thereto.

The preliminary bottom electrode layer PBE, the preliminary middle electrode layer PME, and the preliminary top electrode layer PTE may be formed of metal, a conductive metal nitride, a conductive metal oxide, or a combination of these. In an example, each of the preliminary bottom electrode layer PBE, the preliminary middle electrode layer PME, and the preliminary top electrode layer PTE include a TiN film but is not limited thereto. Rather, for example, the preliminary bottom electrode layer PBE, the preliminary middle electrode layer PME, and the preliminary top electrode layer PTE may include a conductive film formed of a metal or conductive metal nitride and at least one conductive barrier film covering at least a part of the conductive film. The conductive barrier film may be formed of a metal oxide, a metal nitride, or a combination of these but is not limited thereto.

The preliminary selection device layer 134P may be formed of a silicon-containing material, a metal transition oxide, or a chalcogenide glass. The preliminary selection device layer 134P may form a selection device S, e.g., a silicon diode, an oxide diode, or a tunneling diode but is not limited thereto.

The preliminary memory layer 132P may include a resistance change layer and at least one barrier film and/or at least one conductive film covering at least a part of the resistance change layer. In some embodiments, the preliminary memory layer 132P may be formed of a transition metal oxide, a phase change material whose resistance can be changed by Joule's heat generated according to a voltage impressed thereacross, or an MTJ structure. Please refer to a more detailed description of the materials of the memory layer 132 described with reference to FIGS. 1A through 2D for the materials of the preliminary memory layer 132P.

Figure 10B:
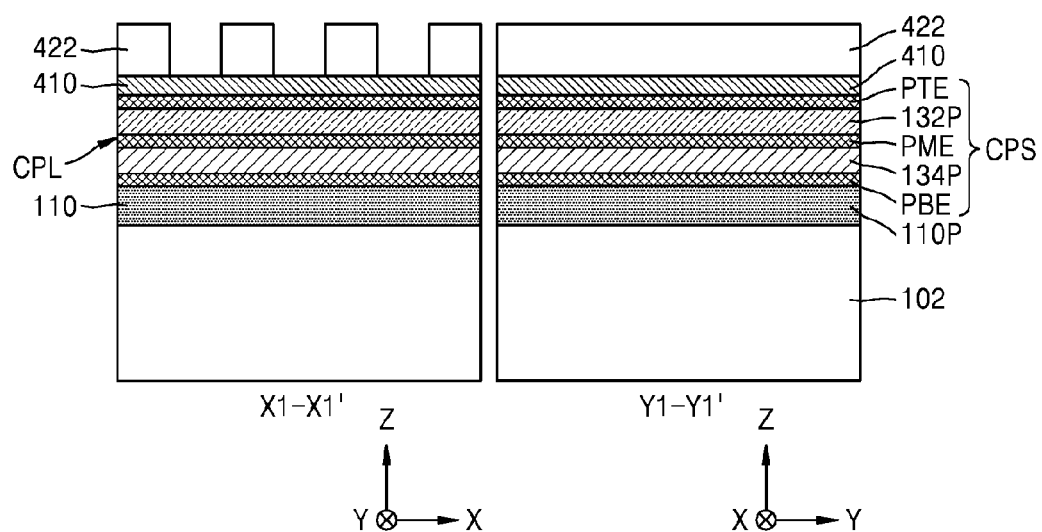

Referring to FIG. 10B, a first mask pattern 422 is formed on the sacrificial film 410.

The first mask pattern 422 may be configured as a plurality of line patterns extending parallel to each other in a first direction (Y direction). The first mask pattern 422 may include a single layer or a multiple layer having a plurality of stacked films. For example, the first mask pattern 422 may be configured as a photoresist pattern, a silicon oxide pattern, a silicon nitride pattern, a silicon oxynitride pattern, a polysilicon pattern, or a combination of these but is not limited thereto. Various materials may be used to form the first mask pattern 422.

Figure 10C:
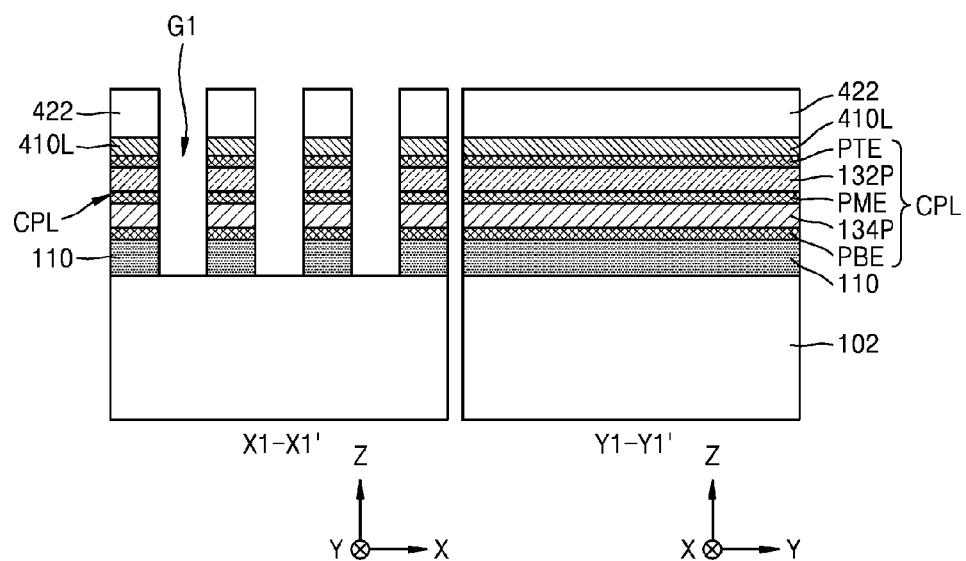

Referring to FIG. 10C, the sacrificial film 410, the stack structure CPS, and the first conductive layer 110P may be anisotropically etched using the first mask pattern 422 as an etch mask such that the cross point array forming stack structure CPS is separated into a plurality of stack lines CPL, and the first conductive layer 110P is separated into a plurality of first conductive lines 110.

As a result, the plurality of first conductive lines 110, the plurality of stack lines CPL, and a plurality of sacrificial lines 410L may be formed extending parallel to each other in the first direction (Y direction), and a plurality of first gaps G1 may be formed extending parallel to each other in the first direction (Y direction) between the plurality of first conductive lines 110, the plurality of stack lines CPL, and the plurality of sacrificial lines 410L.

Figure 10D:
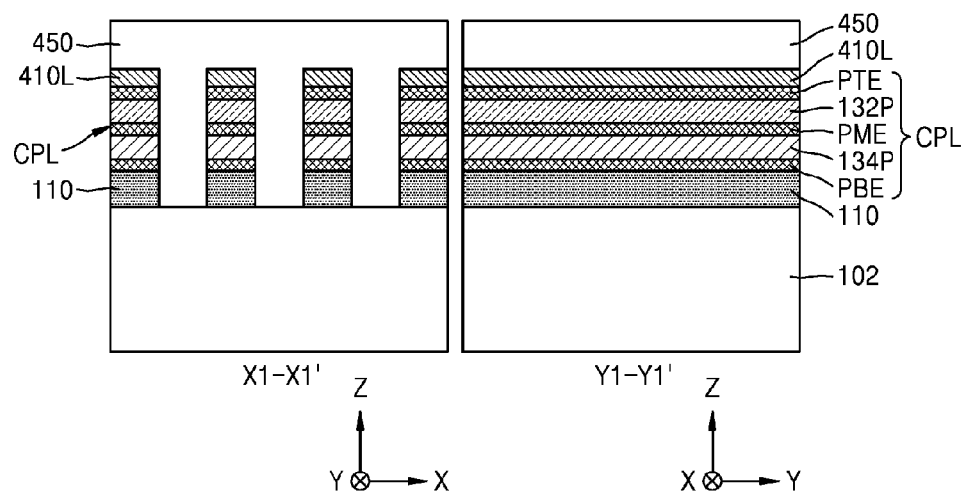

Referring to FIG. 10D, a gap-fill insulating film 450 is formed to fill a plurality of first gaps G1 after exposing top surfaces of the plurality of sacrificial lines 410L by removing the first mask pattern 422 (see FIG. 10C).

The gap-fill insulating film 450 may be formed of a material different from that of the plurality of sacrificial lines 410L. For example, when the plurality of sacrificial lines 410L is formed as a silicon nitride film, the gap-fill insulating film 450 may be a silicon oxide film. The gap-fill insulating film 450 may be one type of insulating film or a plurality of insulating films.

Figure 10E:
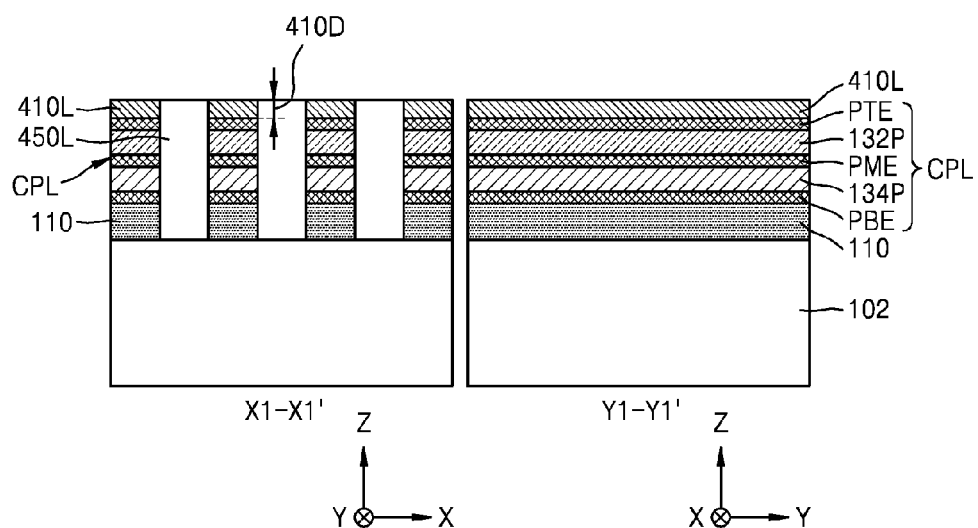

Referring to FIG. 10E, an etch selectivity between the gap-fill insulating film 450 and the plurality of sacrificial lines 410L is used to remove a part of the gap-fill insulating film 450 remaining on the plurality of sacrificial lines 410L such that a plurality of gap-fill insulating lines 450L remains in the plurality of first gaps G1.

After the plurality of gap-fill insulating lines 450L is formed, thicknesses 410D of the plurality of sacrificial lines 410L may be at least the same as lengths L1 (see FIG. 10I) of extension portions 450A (Z direction) of the plurality of insulating pillars 450R obtained from the plurality of gap-fill insulating lines 450L in a process of FIG. 10I that will be described later. The thicknesses 410D of the plurality of sacrificial lines 410L may be at least the same as the depths of pockets in the Z direction delimited by the pocket portions 124 of the uneven first surfaces 120A of the plurality of second conductive lines 120 formed in the process of FIG. 10I that will be described later.

In some embodiments, the gap-fill insulating film 450 (see FIG. 10D) may be polished through a chemical mechanical polishing (CMP) process using the plurality of sacrificial lines 410L as a polishing stop layer so as to allow the plurality of gap-fill insulating lines 450L to remain in the plurality of first gaps G1.

Figure 10F:
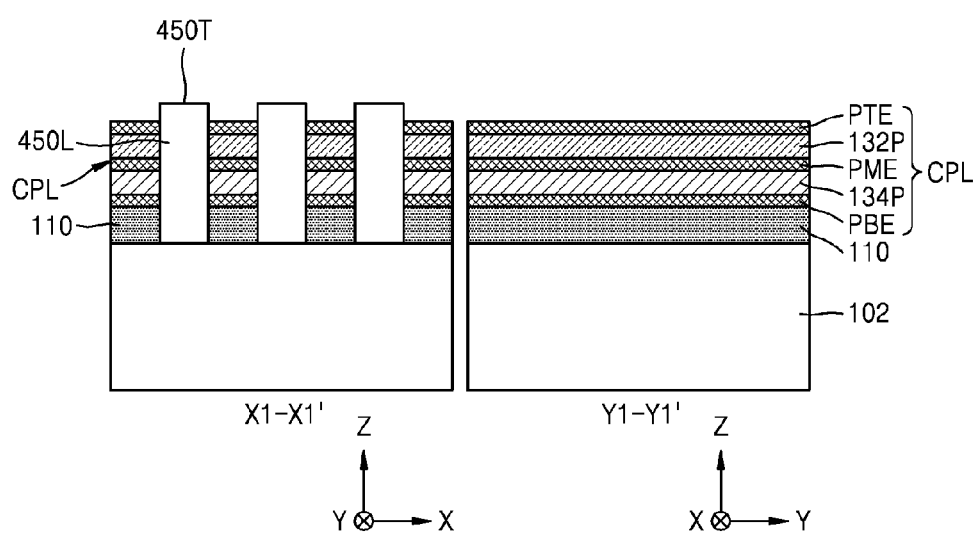

Referring to FIG. 10F, a top surface of the preliminary top electrode layer PTE is exposed by selectively removing the plurality of sacrificial lines 410L using the etch selectivity between the gap-fill insulating film 450 and the plurality of sacrificial lines 410L.

In some embodiments, when the plurality of sacrificial lines 410L is selectively removed, in a case where the plurality of gap-fill insulating lines 450L is formed as a silicon oxide film, and the plurality of sacrificial lines 410L is formed as a silicon nitride film, a dry etching process that uses a $CH_xF_y$ compound (wherein x and y are integers greater than 1, and (x/y)≥1) as a main etch gas may be used to secure a high etch selectivity of the plurality of sacrificial lines 410L with respect to the plurality of gap-fill insulating lines 450L. In some embodiments, $CH_3F$ (fluoromethane) and/or $CH_2F_2$ (difluoromethane) may be used as the $CH_xF_y$ compound, but the inventive concept is not limited thereto.

A level of top surfaces 450T of the plurality of gap-fill insulating lines 450L is higher than that of the exposed top surface of the preliminary top electrode layer PTE. Thus, after the plurality of sacrificial lines 410L is removed, part of each of the plurality of gap-fill insulating lines 450L protrudes form the resultant structure in a direction away from the substrate 102.

Figure 10G:
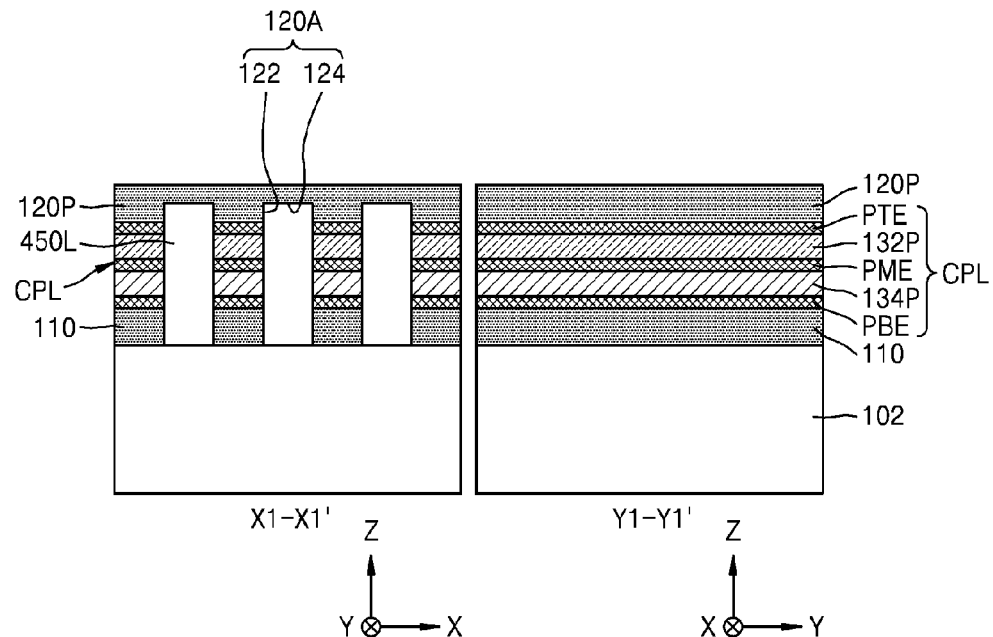

Referring to FIG. 10G, a second conductive layer 120P is formed on the exposed top surface of the preliminary top electrode layer PTE and the protruding top surfaces of the plurality of gap-fill insulating lines 450L.

The second conductive layer 120P may be formed of metal, a conductive metal nitride, a conductive metal oxide, or a combination of these. In some embodiments, the second conductive layer 120P may be formed of W, WN, Au, Ag, Cu, Al, TiAlN, Ir, Pt, Pd, Ru, Zr, Rh, Ni, Co, Cr, Sn, Zn, ITO, an alloy of these, or a combination of these. In other embodiments, the second conductive layer 120P may include a metal film and a conductive barrier film covering at least a part of the metal film. The conductive barrier film may be formed of, for example, Ti, TiN, Ta, TaN, or a combination of these but is not limited thereto.

Figure 10H:
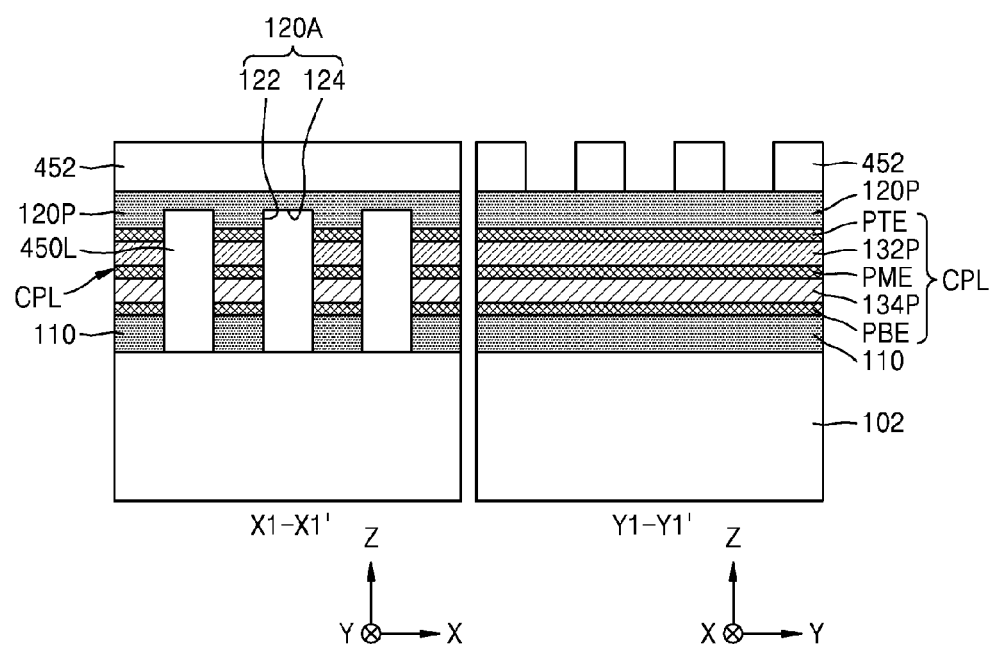

Referring to FIG. 10H, a second mask pattern 452 is formed on the second conductive layer 120P.

The second mask pattern 452 may be configured as a plurality of line patterns extending parallel to each other in a second direction (X direction). The second mask pattern 452 may include a single layer or a multiple layer having a plurality of stacked films. For example, the second mask pattern 452 may be a photoresist pattern, a silicon oxide pattern, a silicon nitride pattern, a silicon oxynitride pattern, a polysilicon pattern, or a combination of these but is not limited thereto. Various materials may be used to form the second mask pattern 452.

Figure 10I:
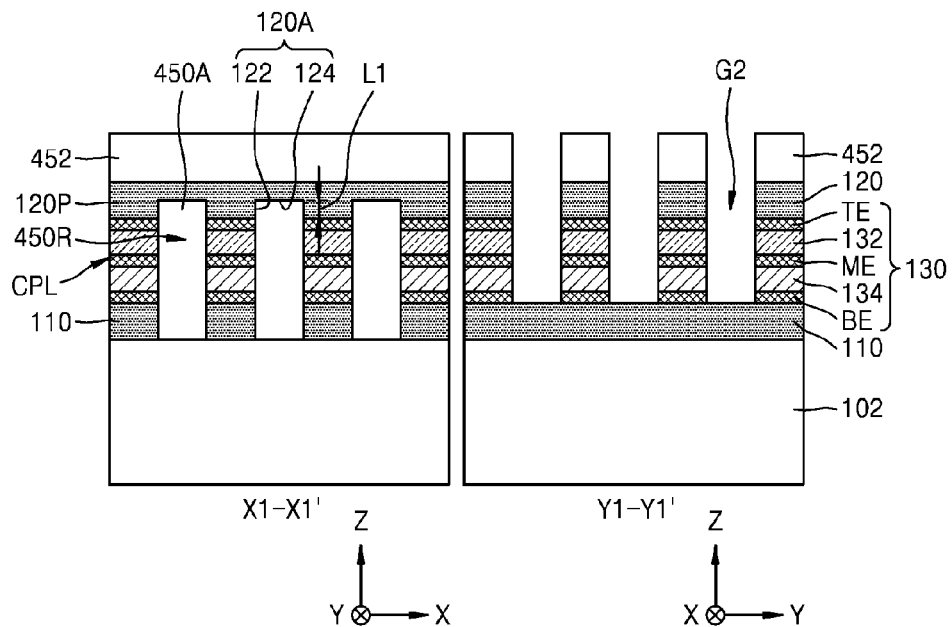

Referring to FIG. 10I, the second conductive layer 120P, the plurality of stack lines CPL, and the plurality of gap-fill insulating lines 450L may be anisotropically etched using the second mask pattern 452 as an etch mask such that the second conductive layer 120P is separated into the plurality of second conductive lines 120, and the plurality of stack lines CPL is separated into the plurality of memory cell pillars 130.

As a result, the plurality of memory cell pillars 130 are formed at a plurality of crossing points between the plurality of first conductive lines 110 and the plurality of second conductive lines 120, and the plurality of gap-fill insulating lines 450L is separated into the plurality of insulating pillars 450R.

The plurality of insulating pillars 450R includes the extension portions 450A protruding from the top surface of the top electrode layer TE in a direction (Z direction) away from the substrate 102.

The plurality of second conductive lines 120 includes the pockets delimited by the plurality of pocket portions 124 of the uneven first surfaces 120A and accommodating the extension portions 450A of the plurality of insulating pillars 450R, and the plurality of protrusion portions 122 of the uneven first surfaces 120A facing the memory cell pillars 130.

A plurality of second gaps G2 may be formed between the plurality of memory cell pillars 130 and the plurality of second conductive lines 120 that are aligned in the first direction (Y direction).

Figure 10J:
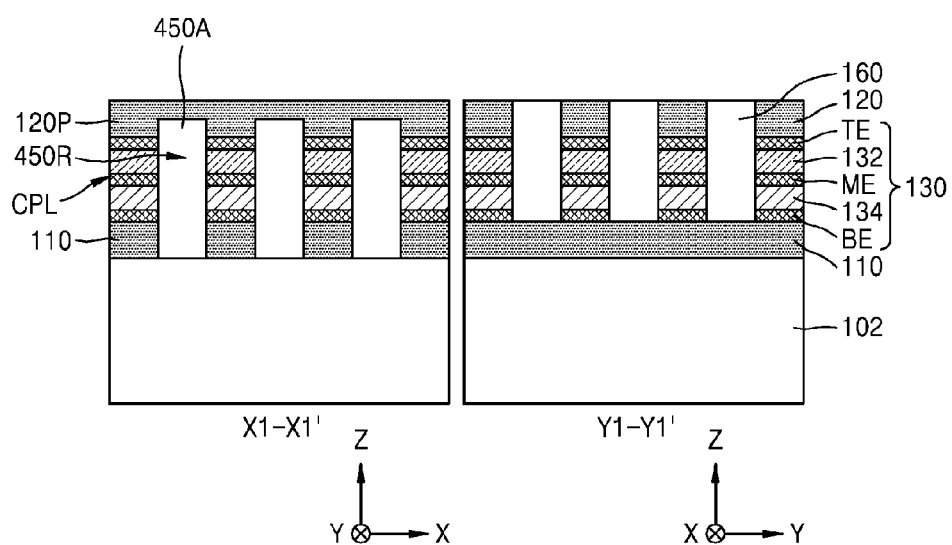

Referring to FIG. 10J, after the second mask pattern 452 (see FIG. 10I) is removed, in a similar way to described with reference to FIGS. 10D through 10E, the insulating lines 160 are formed in the second gaps G2.

Each of the plurality of insulating lines 160 is disposed between adjacent ones of the memory cell pillars 130 disposed in a line in the first direction (Y direction). The insulating lines 160 extend parallel to each other in the second direction (X direction).

The second conductive lines 120 and the insulating lines 160 are alternately arranged in the first direction (Y direction) in the resistive memory device 100.

In some embodiments, an insulating film filling the plurality of second gaps G2 and covering the plurality of second conductive lines 120 may be formed and polished through the CMP process using the plurality of second conductive lines 120 as the polishing stop layer so as to allow the plurality of insulating lines 160 to remain in the plurality of second gaps G2.

The plurality of insulating lines 160 may be formed of a silicon oxide film, a silicon nitride film, or a combination of these but the inventive concept is not limited thereto. In some embodiments, the plurality of insulating lines 160 may be formed as multiple layers of a plurality of insulating films.

Figure 10K:
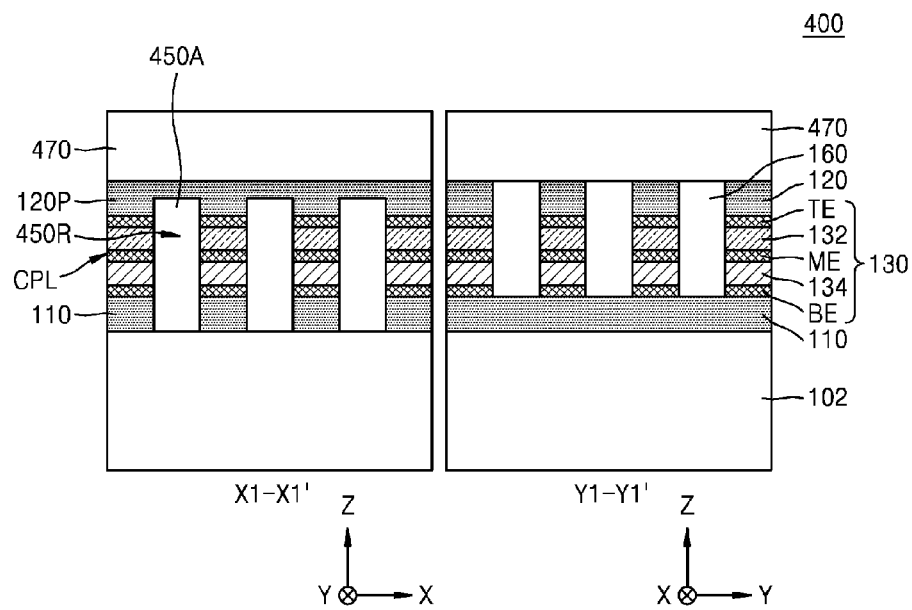

Referring to FIG. 10K, an interlayer insulating film 470 covering the plurality of insulating lines 160 and the plurality of second conductive lines 120 is formed.

The interlayer insulating film 470 may be formed of an oxide film, a nitride film, or a combination of these.

In some embodiments, a process of forming the interlayer insulating film 470 described with reference to FIG. 10K may be omitted as circumstances allow.

In other embodiments, after the process of FIG. 10I is performed, instead of the process described with reference to FIGS. 10J and 10K, an interlayer insulating film (not shown) is formed to fill the plurality of second gaps G2 and cover a top surface of the second mask pattern 452, and a top surface of the interlayer insulating film is planarized, thereby forming a resultant structure in which at least a part of the second mask pattern 452 and at least a part of the interlayer insulating film remain.

Although the method of manufacturing the resistive memory device 400 has been described in connection with the manufacturing of the resistive memory device 100 of FIGS. 1A through 2D as an example, it will be clear to those of ordinary skill in the art as to how the method may be adapted to manufacture the resistive memory device 200 of FIGS. 5A through 5C, the resistive memory device 300 of FIG. 7, or devices having structures similar to those of the resistive memory devices 200 and 300 within the scope of the inventive concept.

FIGS. 11A through 11K are cross-sectional views showing a method of manufacturing a resistive semiconductor device 500, according to other embodiments of the inventive concept.

The resistive semiconductor device 500 (see FIG. 11K) has a structure similar to that of the resistive semiconductor device 100 of FIGS. 1A through 2D. Like reference numerals in FIGS. 11A through 11K and FIGS. 1A through 2D denote like elements, and thus the like elements will not be described here again in detail. Thus, the method is similar to that described with reference to FIGS. 10A-10K and reference may be made to the processes described with respect to these figures. An exception is that the method of manufacturing the resistive semiconductor device 500, as will be described in more detail below, includes forming insulating pillars 550 (see FIG. 11K) at least parts of which include air spaces AS1 instead of solid insulating pillars 150 as described with reference to FIGS. 1A through 2D.

Figure 11A:
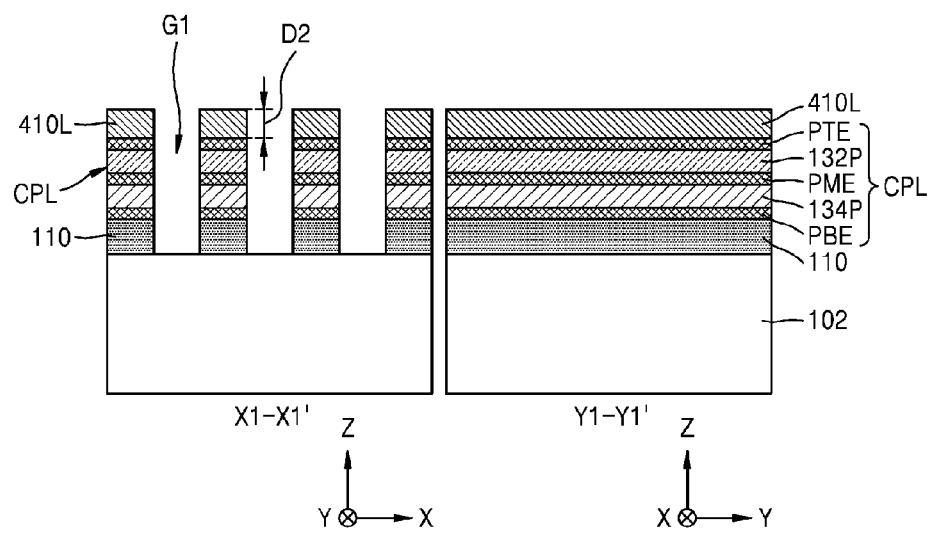
FIGS. 11A, 11B, 11C, 11D, 11E, 11F, 11G, 11H, 11I, 11J and 11K are cross-sectional views sequentially showing a method of manufacturing a resistive semiconductor device, according to other embodiments of the inventive concept, each taken in directions corresponding to directions along lines X1-X1' and Y1-Y1 of FIG. 1A.

Referring to FIG. 11A, processes described with reference to FIGS. 10A through 10C are performed. Then, the first mask pattern 422 is removed.

In FIG. 11A, the plurality of sacrificial lines 410L may be formed to any of various thicknesses D2 according to desired design specifications.

Figure 11B:
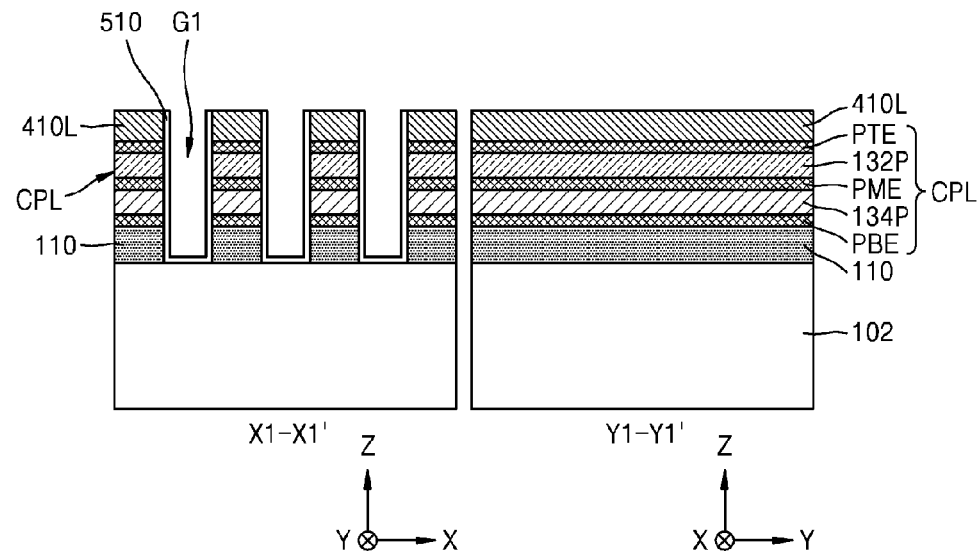

Referring to FIG. 11B, an insulating liner 510 conformally covering inner walls of the plurality of first gaps G1 is formed.

In some embodiments, the insulating liner 510 may be formed as a silicon nitride film. To form the insulating liner 510, after a preliminary insulating liner is formed on a structure, having the first gaps G1, by an atomic layer deposition (ALD) process or a CVD process, an unnecessary part of the insulating liner extending outside of the plurality of first gaps G1 is removed by an etch back process so that the insulating liner 510 remains only in the plurality of first gaps G1.

Figure 11C:
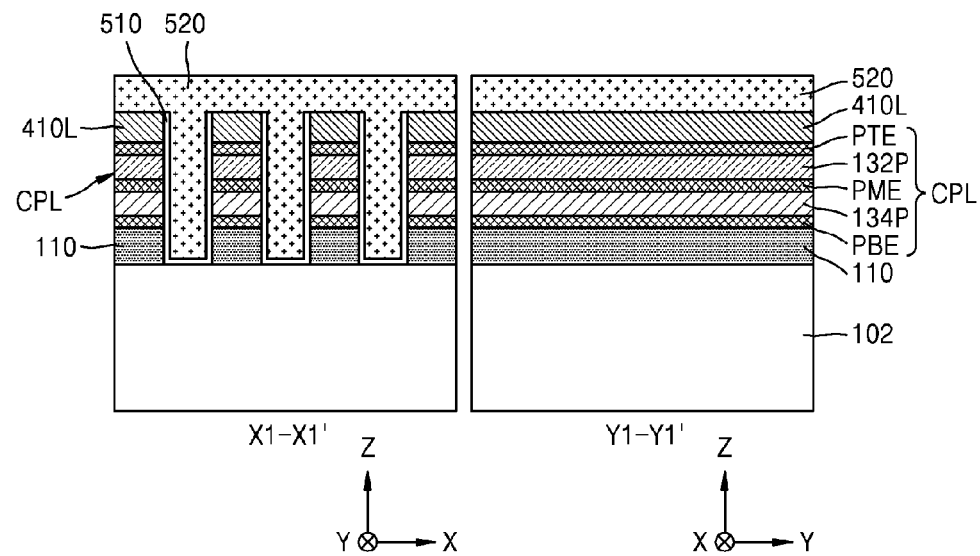

Referring to FIG. 11C, a sacrificial film 520 filling the first gaps G1 and covering top surfaces of the sacrificial lines 410L is formed so as to also cover the insulating liner 510.

In some embodiments, the sacrificial layer 520 may be formed of a spin on hardmask (SOH) material. The sacrificial layer 520 formed of the SOH material may be formed of a carbon-containing organic compound having a relatively high carbon content in the range of about 85 to about 99 wt %. The carbon-containing organic compound may be a hydrocarbon containing an aromatic ring such as phenyl, benzene, or naphthalene or its derivative.

A spin coating process or a CVD process may be used to form the sacrificial film 520.

A process of forming the sacrificial film 520 formed of the SOH material will now be described below. First, an organic compound layer is formed to a thickness sufficient to fill the plurality of first gaps G1. In this regard, the spin coating process or another deposition process may be used. The organic compound layer may be formed of a hydrocarbon containing an aromatic ring such as phenyl, benzene, or naphthalene or its derivative. The organic compound layer may be formed of a material having a relatively high carbon content in the range of about 85 to about 99 wt %. The organic compound layer is firstly baked at a temperature in the range of about 150~about 350° C. The organic compound layer may be firstly baked for about 60 seconds. Subsequently, the organic compound layer is secondly baked and cured at a temperature in the range of about 300~about 550° C. to form the sacrificial layer 520. The organic compound layer may be secondly baked for about 30~about 300 seconds.

Figure 11D:
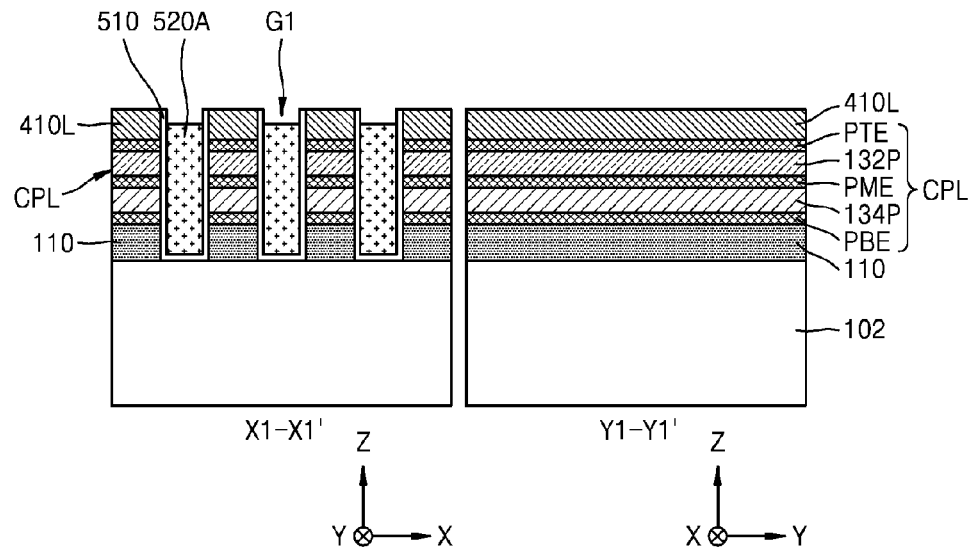

Referring to FIG. 11D, the part of the sacrificial layer 520 outside the plurality of first gaps G1 and parts thereof at entrances to the first gaps G1 are removed to form a sacrificial layer 520A for forming a plurality of air spaces in the first gaps G1.

An etch back process may be used to remove these parts of the sacrificial film 520.

That is, after the sacrificial layer 520A is formed, parts of the first gaps G1 may be revealed, i.e., recesses are formed in the regions in which the insulating pillars are to be formed.

Figure 11E:
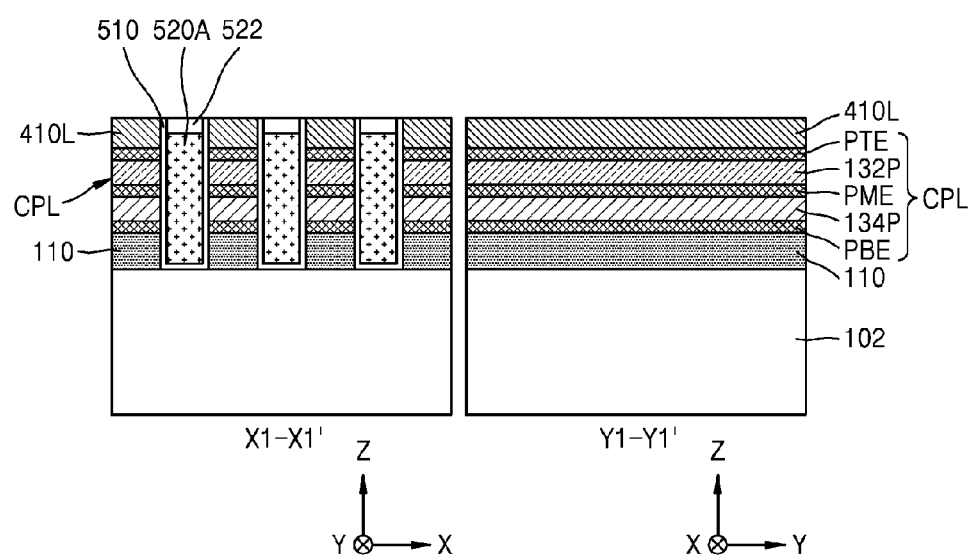

Referring to FIG. 11E, a plurality of insulating patterns 522 filling the empty recesses are formed.

The plurality of insulating patterns 522 may act to define an upper limit of air spaces to be formed during a subsequent process.

The plurality of insulating patterns 522 may be formed of a material different from that of the plurality of sacrificial lines 410L. For example, when the plurality of sacrificial lines 410L is formed of a nitride film, the plurality of insulating patterns 522 may be formed of an oxide film. However, the materials of the plurality of sacrificial lines 410L and the plurality of insulating patterns 522 are not limited thereto; that is, other combinations of materials may be used instead.

Figure 11F:
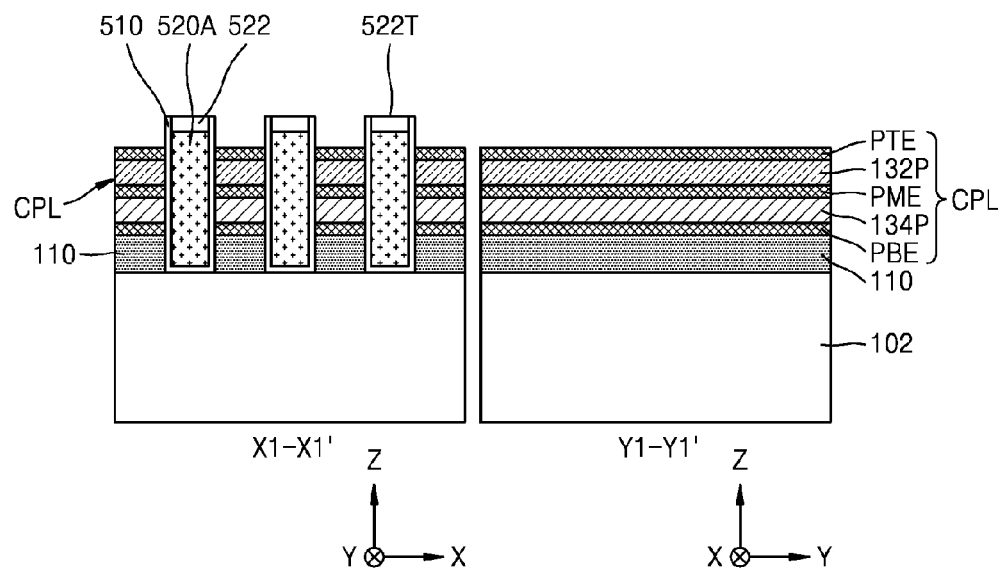

Referring to FIG. 11F, a top surface of the preliminary top electrode layer PTE is exposed by selectively removing the plurality of sacrificial lines 410L in a manner similar to that described with reference to FIG. 10F.

An etch selectivity between the plurality of insulating patterns 522 and the plurality of sacrificial lines 410L may be used to selectively remove the plurality of sacrificial lines 410L. This was described in detail with reference to FIG. 10F.

A level of top surfaces 522T of the plurality of insulating patterns 522 is higher than that of the exposed top surface of the preliminary top electrode layer PTE in a resultant structure formed by removing the plurality of sacrificial lines 410L. Thus, after the plurality of sacrificial lines 410L is removed, part of each of the plurality of insulating patterns 522 protrudes from the structure in a direction away from the substrate 102.

Figure 11G:
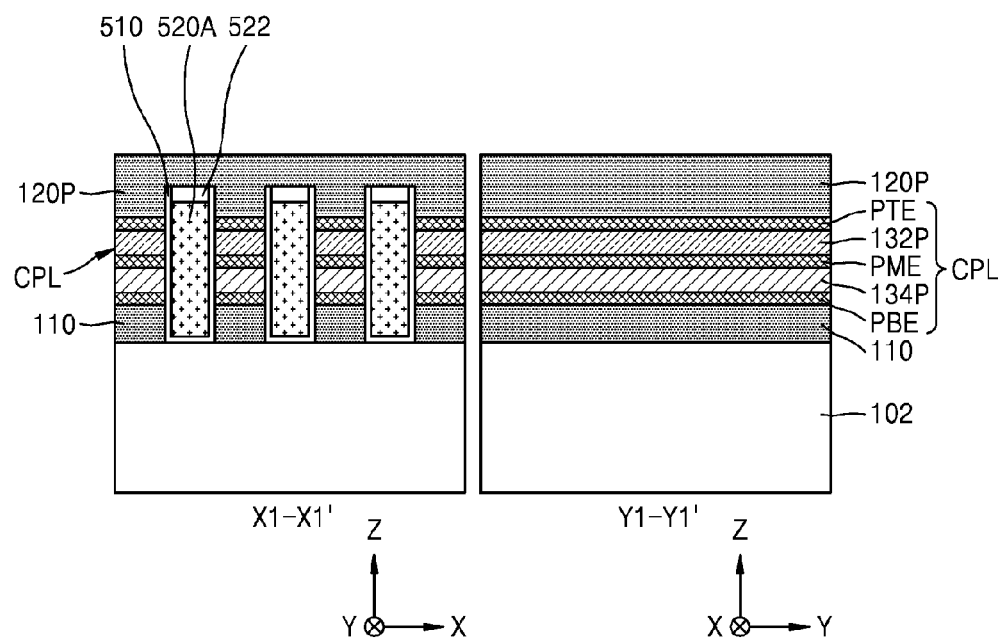

Referring to FIG. 11G, the second conductive layer 120P is formed on the exposed top surface of the preliminary top electrode layer PTE and the protruding top surfaces of the plurality of insulating patterns 522 in the same manner described with reference to FIG. 10G.

Figure 11H:
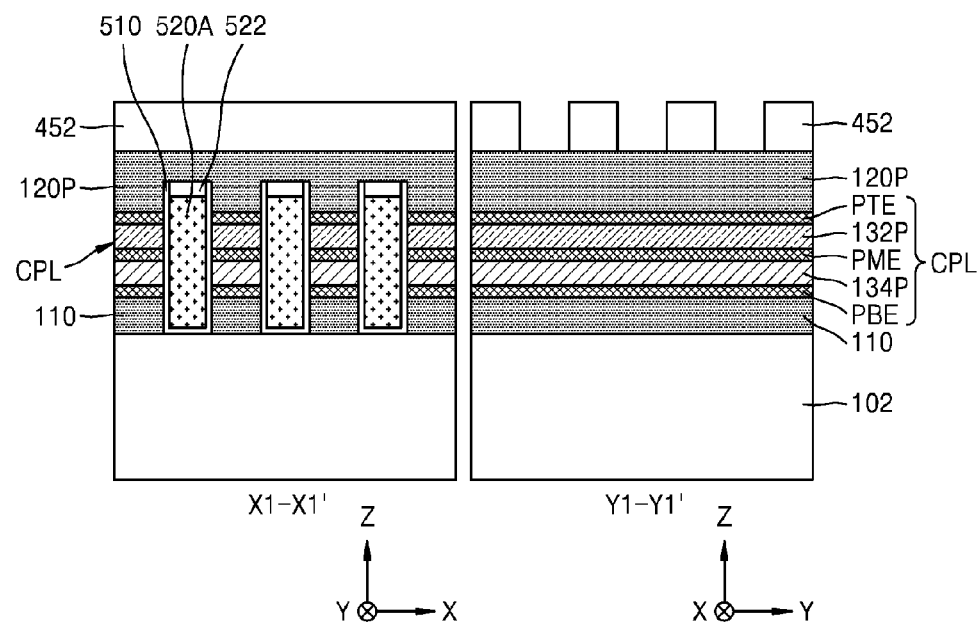

Referring to FIG. 11H, the second mask pattern 452 is formed on the second conductive layer 120P in the same manner described with reference to FIG. 10H.

Figure 11I:
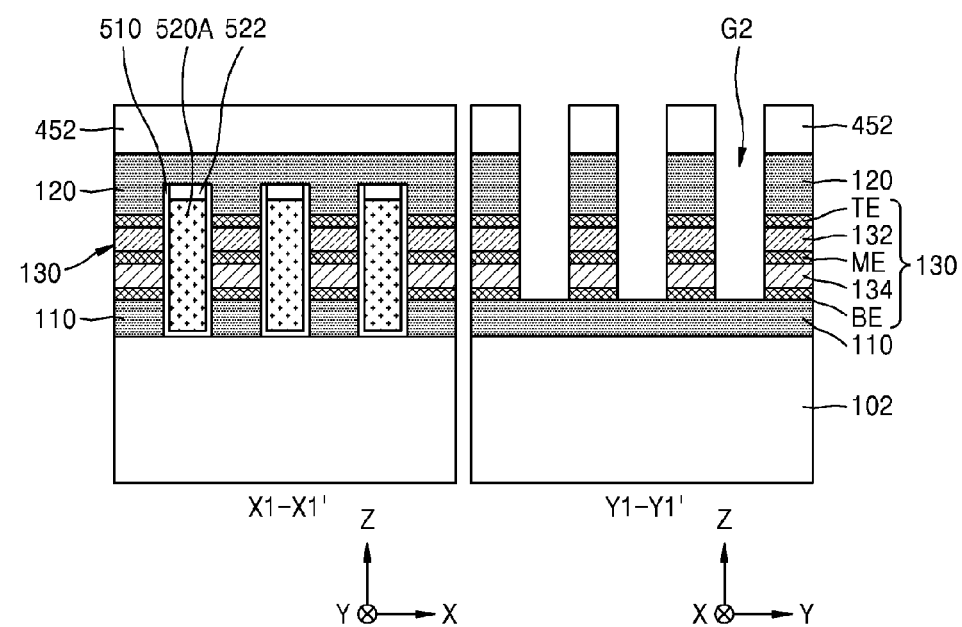

Referring to FIG. 11I, an anisotropic etching process is performed using the second mask pattern 452 as an etch mask such that the second conductive layer 120P is separated into the plurality of second conductive lines 120, and the plurality of stack lines CPL is separated into the plurality of memory cell pillars 130 in the manner described with reference to FIG. 10I.

As a result, the memory cell pillars 130 are formed at the crossing points between the plurality of first conductive lines 110 and the plurality of second conductive lines 120. The plurality of second gaps G2 may be formed between the plurality of memory cell pillars 130 and the plurality of second conductive lines 120 that are aligned in a first direction (Y direction). Side wall surfaces of each sacrificial layer 520A may be exposed through the plurality of second gaps G2.

Figure 11J:
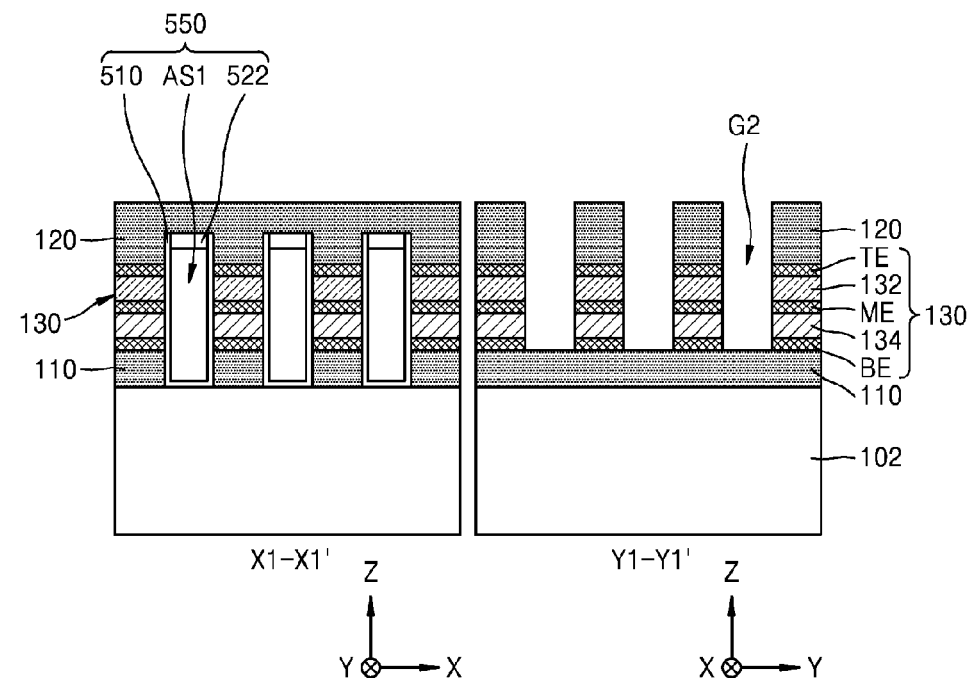

Referring to FIG. 11J, the second mask pattern 452 (see FIG. 10I) is removed, and the sacrificial layer 520A is removed through ashing and strip processes, thereby forming the plurality of air spaces AS1 between the plurality of memory cell pillars 130 disposed in a line in a second direction (X direction).

An insulating liner 510, air spaces AS1, and insulating pattern 522 may together constitute the insulating pillar 550. The plurality of insulating pillars 550 may correspond to the plurality of insulating pillars 150 of the resistive memory device 100 described with reference to FIGS. 1A through 2D.

The method is not necessarily limited to the described sequence of removing the second mask pattern 452 and the sacrificial layer 520A for forming the plurality of air spaces. For convenience, the second mask pattern 452 may be removed first or the sacrificial layer 520A for forming the plurality of air spaces may be removed first. In some embodiments, when the second mask pattern 452 includes a photoresist pattern, the photoresist pattern and the sacrificial layer 520A for forming the plurality of air spaces may be simultaneously removed by the ashing and strip processes.

Figure 11K:
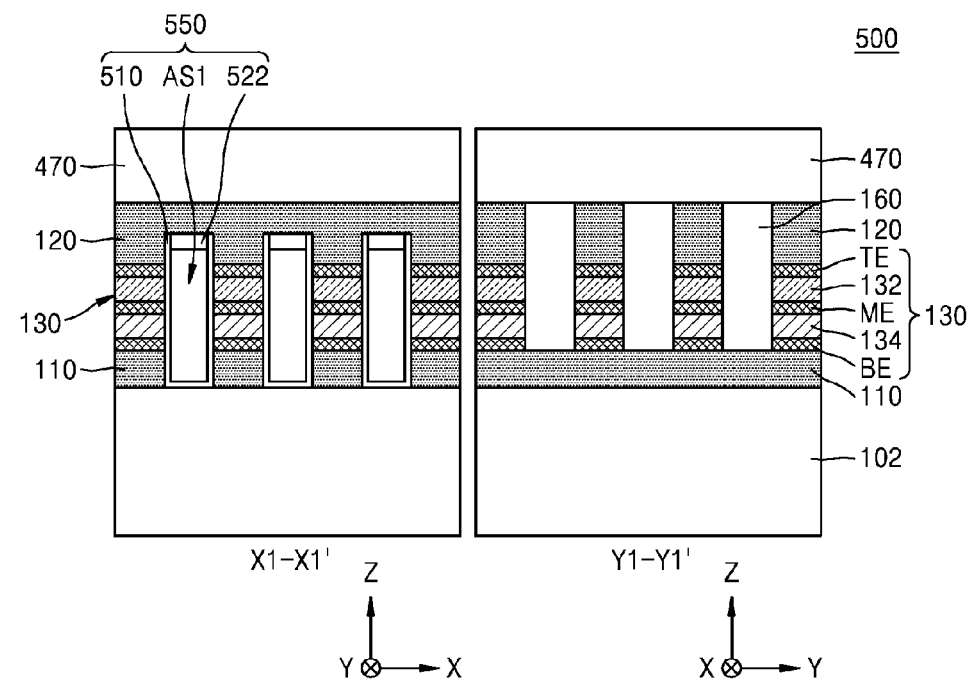

Referring to FIG. 11K, the plurality of insulating lines 160 filling the plurality of second gaps G2 and the interlayer insulating film 470 covering the plurality of insulating lines 160 and the plurality of second conductive lines 120 are formed in the same manner described with reference to FIGS. 10J and 10K.

The forming of the interlayer insulating film 470 described with reference to FIG. 11K may be omitted as circumstances dictate.

The resistive memory device 500 manufactured by the method described with reference to FIGS. 11A through 11K includes the plurality of insulating pillars 550 including the plurality of air spaces AS1 formed between the plurality of memory cell pillars 130 disposed in the line in the second direction (X direction). A parasitic capacitance that may be present as a coupling component between the plurality of memory cell pillars 130 and between neighboring conductive lines may be reduced.

A process of forming the plurality of insulating pillars 550 including the plurality of air spaces AS1 may be performed at a processing temperature that is a relatively low, for example, in the range of about 300~about 400° C. Thus, another process of forming an insulating film requiring a relatively high temperature densification process when forming the plurality of insulating pillars 550 may not be necessary. Thus, a thermal load applied to the plurality of memory cell pillars 130 vulnerable to a thermal budget may be reduced, thereby preventing an electrical characteristic of the resistive memory device 500 from deteriorating.

Although the method of manufacturing the resistive memory device 500 having a similar structure to that of the resistive memory device 100 of FIGS. 1A through 2D is described with reference to FIGS. 11A through 11K, those of ordinary skill in the art will readily understand how the method may be adapted to manufacture the resistive memory device 200 of FIGS. 5A through 5C, the resistive memory device 300 of FIG. 7, or devices having similar structures to those of the resistive memory devices 200 and 300 within the scope of the inventive concept.

FIGS. 12A through 12E are cross-sectional views sequentially showing a method of manufacturing a resistive semiconductor device 600 (see FIG. 12E), according to other embodiments of the inventive concept.

The resistive semiconductor device 600 (see FIG. 12E) has a structure similar to that of the resistive semiconductor device 100 of FIGS. 1A through 2D. Like reference numerals in FIGS. 12A through 12E and in FIGS. 1A through 2D and 11A through 11K denote like elements, and thus the like elements will not be described here again in detail. Thus, the method is similar to that described with reference to FIGS. 10A through 10K and 11A through 11K and reference may be made to the processes described with respect to these figures. An exception is that the method of manufacturing the resistive semiconductor device 600, as will be described in more detail below, includes (see FIG. 12E) forming insulating pillars 550 at least parts of which includes an air space AS1 instead of the solid insulating pillars 150 described with reference to FIGS. 1A through 2D, and insulating lines 660 (see FIG. 12E) at least parts of which include air spaces AS2 instead of the solid insulating lines 160 described with reference to FIGS. 1A through 2D.

Figure 12A:
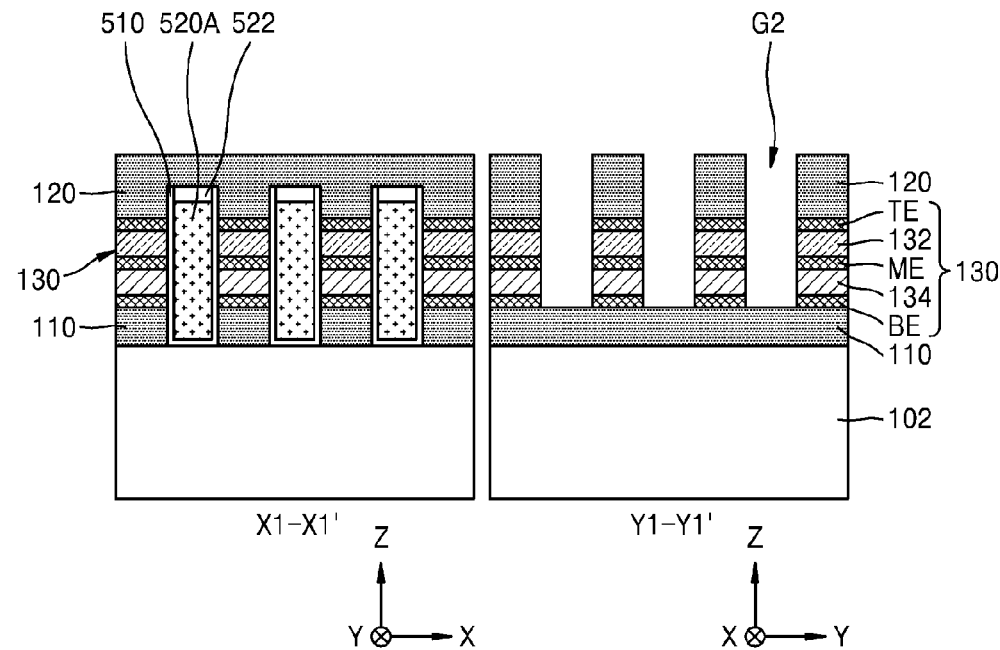
FIGS. 12A, 12B, 12C, 12D and 12E are cross-sectional views sequentially showing a method of manufacturing a resistive semiconductor device, according to other embodiments of the inventive concept, each taken in directions corresponding to directions along lines X1-X1' and Y1-Y1 of FIG. 1A.

Referring to FIG. 12A, top surfaces of the plurality of second conductive lines 120 are exposed by removing the second mask pattern 452 (used as an etch mask in forming the plurality of second gaps G2) after the processes described with reference to FIGS. 11A through 11I are performed.

Figure 12B:
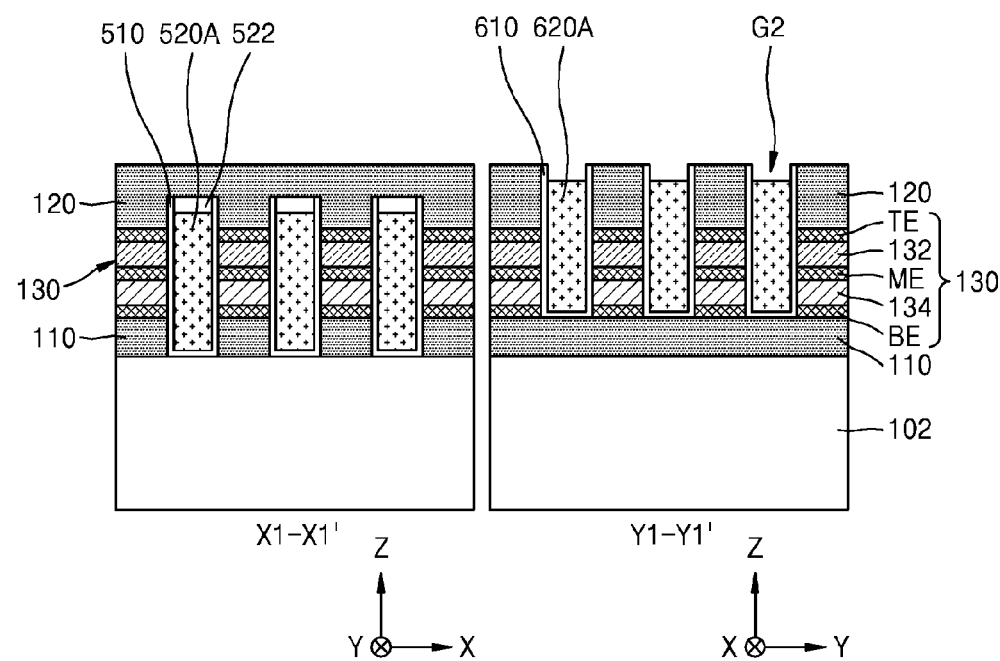

Referring to FIG. 12B, an insulating liner 610 covering side wall surfaces of each of the plurality of memory cell pillars 130 and sides of each of the plurality of second gaps G2 is formed, and an air space-forming sacrificial film 620A filling a part of each of the plurality of second gaps G2 is formed on the insulating liner 610, in the same manner in which the insulating layer 510 and the air space-forming sacrificial film 520A are formed as described with reference to FIGS. 11B through 11D.

Figure 12C:
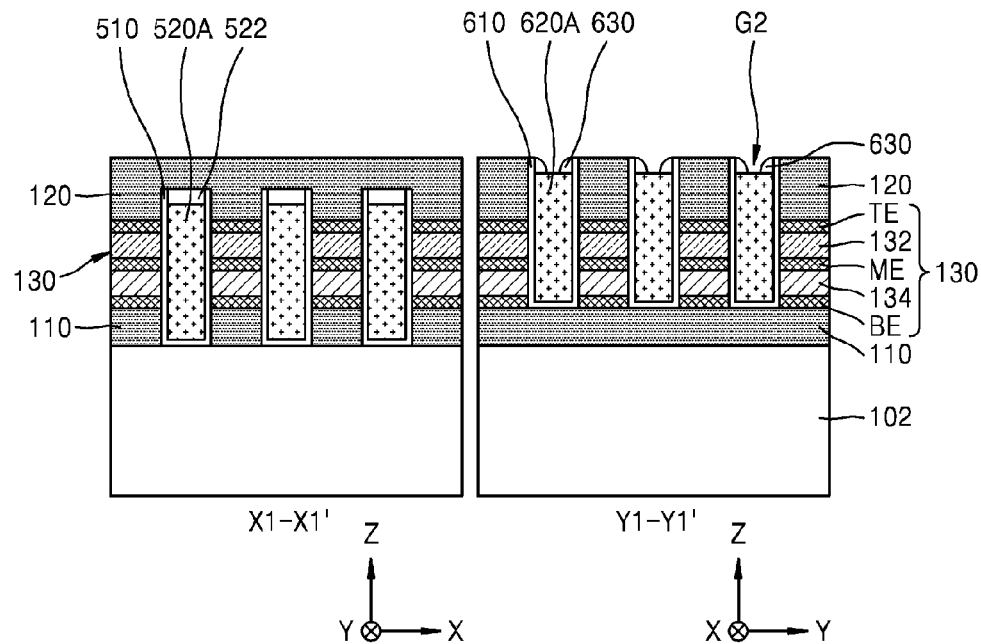

Referring to FIG. 12C, a plurality of insulating spacers 630 covering upper parts of side wall surfaces of the insulating liner 610 exposed at an entrance of each of the plurality of second gaps G2 are formed.

The plurality of insulating spacers 630 may be respectively formed on the sacrificial films 620A and may act to in effect reduce the size of an entrance of each of the plurality of second gaps G2.

The insulating spacers 630 may be formed by first forming a spacer insulating film covering an exposed surface of the resultant structure formed after the sacrificial films 620A have been formed, and removing parts of the spacer insulating film through an etch back process. In an example, the spacer insulating film may be formed as an oxide film formed through an ALD process.

Figure 12D:
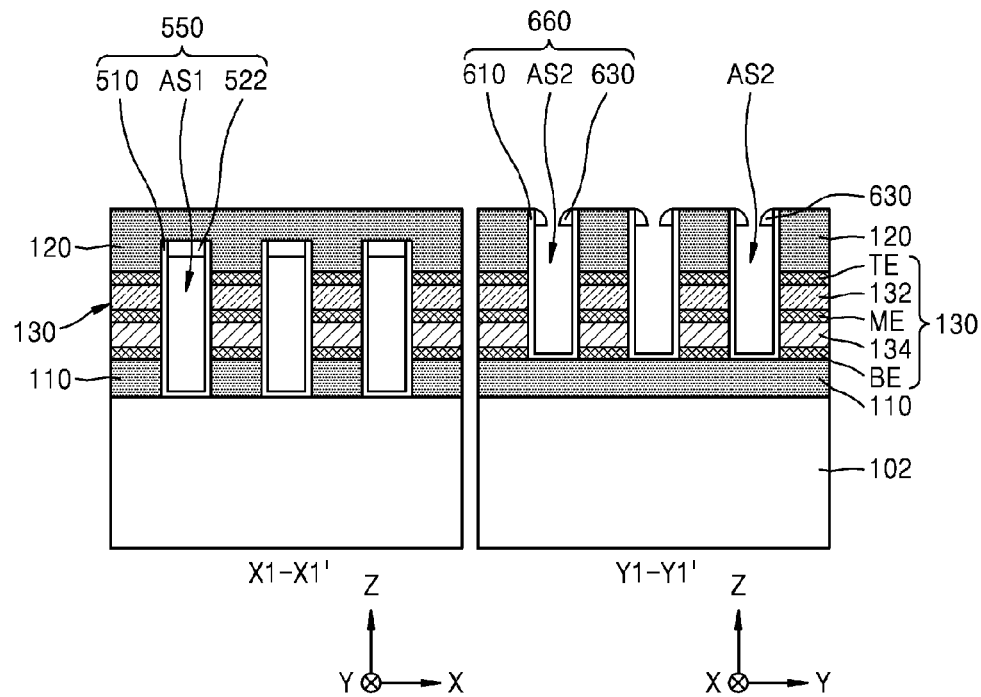

Referring to FIG. 12D, in a similar way to the process described with reference to FIG. 11J, the air space-forming sacrificial films 520A and 620A are ashed, stripped, and removed from the plurality of second gaps G2 through spaces between the plurality of insulating spacers 630.

As a result, the plurality of air spaces AS1 between the plurality of memory cell pillars 130 arranged in a line in a second direction (X direction) and the plurality of air spaces AS2 between the plurality of memory cell pillars 130 arranged in a line in a first direction (Y direction) are simultaneously formed.

The plurality of air spaces AS1 and AS2 may be connected to each other. Thus, the sides of each of the plurality of memory cell pillars 130 may be surrounded by the plurality of air spaces AS1 and AS2.

The plurality of insulating lines 660 includes the plurality of insulating liners 610, the plurality of air spaces AS2, and the plurality of insulating spacers 630. The plurality of insulating lines 660 may correspond to the plurality of insulating lines 160 of the resistive memory device 100 described with reference to FIGS. 1A through 2D.

Figure 12E:
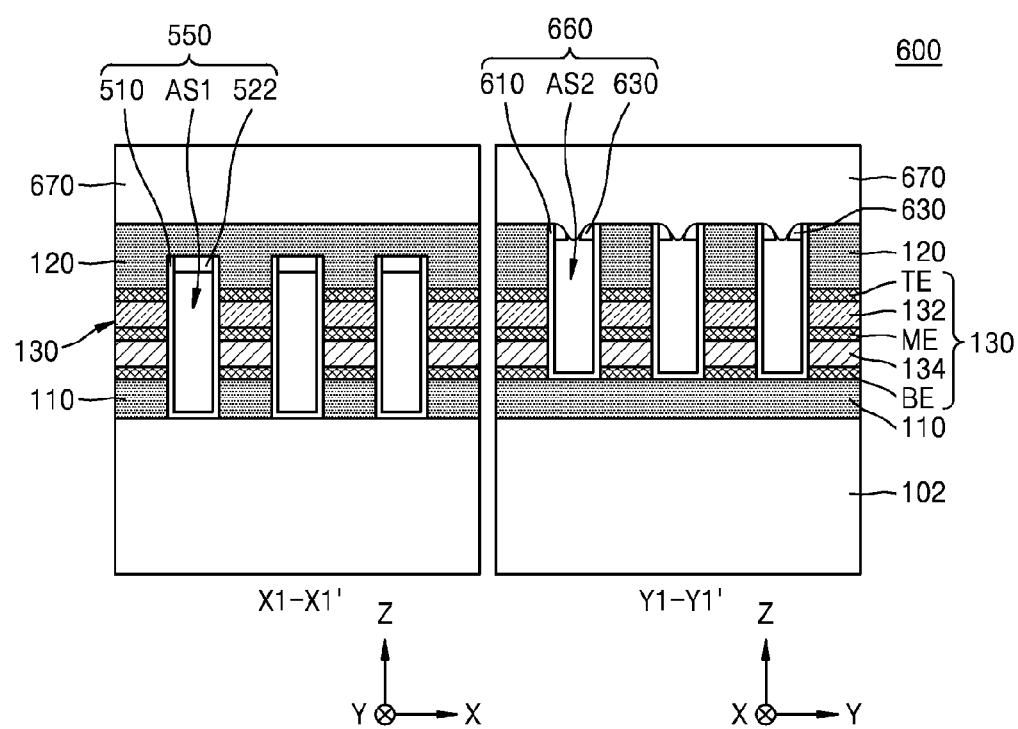

Referring to FIG. 12E, an interlayer insulating film 670 covering top surfaces of the plurality of second conductive lines 120 and top surfaces of the plurality of insulating spacers 630 disposed on the plurality of air spaces AS2 is formed.

When the insulating material for forming the interlayer insulating film 670 is deposited, insulating spacers 630 limit the step coverage of the insulating material, thereby preventing the insulating film 670 from entering the plurality of air spaces AS2 through the spaces between the plurality of insulating spacers 630.

The resistive memory device 600 manufactured using the method described with reference to FIGS. 12A through 12E includes the plurality of insulating pillars 550 having the plurality of air spaces AS1 formed between the plurality of memory cell pillars 130 disposed in the line in the second direction (X direction), and the plurality of insulating lines 660 having the plurality of air spaces AS2 formed between the plurality of memory cell pillars 130 disposed in the line in the first direction (Y direction). A parasitic capacitance that may be present between the plurality of memory cell pillars 130 and between neighboring conductive lines may be reduced by the plurality of air spaces AS1 and AS2.

A process of forming the plurality of insulating pillars 550 may be performed at a processing temperature that is relatively low, for example, in the range of about 300~about 400° C. Thus, another process of forming an insulating film requiring a relatively high temperature densification process in forming the plurality of insulating pillars 550 and the plurality of insulating lines 660 may not be necessary. Thus, a thermal load applied to the plurality of memory cell pillars 130 vulnerable to a thermal budget may be reduced, thereby preventing an electrical characteristic of the resistive memory device 500 from deteriorating.

The plurality of air spaces AS1 and AS2 surrounding the memory cell pillars 130 may be uniformly distributed in the resistive memory device 600. Thus, a relatively uniform switching characteristic may be exhibited by the memory cell pillars 130 throughout the entire resistive memory device 600.

Although the method of manufacturing the resistive memory device 600 having a structure similar to that of the resistive memory device 100 of FIGS. 1A through 2D is described with reference to FIGS. 12A through 12E, those of ordinary skill in the art will readily understand how the method may be adapted to manufacture the resistive memory device 200 of FIGS. 5A through 5C, the resistive memory device 300 of FIG. 7, or devices having similar structures to those of the resistive memory devices 200 and 300 with reference to FIGS. 12A through 12E within the scope of the inventive concept.

FIGS. 13A through 13H are cross-sectional views sequentially showing a method of manufacturing a resistive semiconductor device 700 (see FIG. 13H), according to other embodiments of the inventive concept.

The method of manufacturing the resistive semiconductor device 700 (see FIG. 13H) is similar to that of the method of manufacturing the resistive semiconductor device 100 of FIGS. 1A through 2D. Like reference numerals between FIGS. 13A through 13H and FIGS. 1A through 12E denote like elements, and thus the like elements will not be described again in detail.

The method of manufacturing the resistive semiconductor device 700 described with reference to FIGS. 13A through 13H is distinguished from the method of manufacturing the resistive semiconductor device 100 described with reference to FIGS. 10A through 10K in that the method of FIGS. 13A through 13H does not use the sacrificial film 410.

Figure 13A:
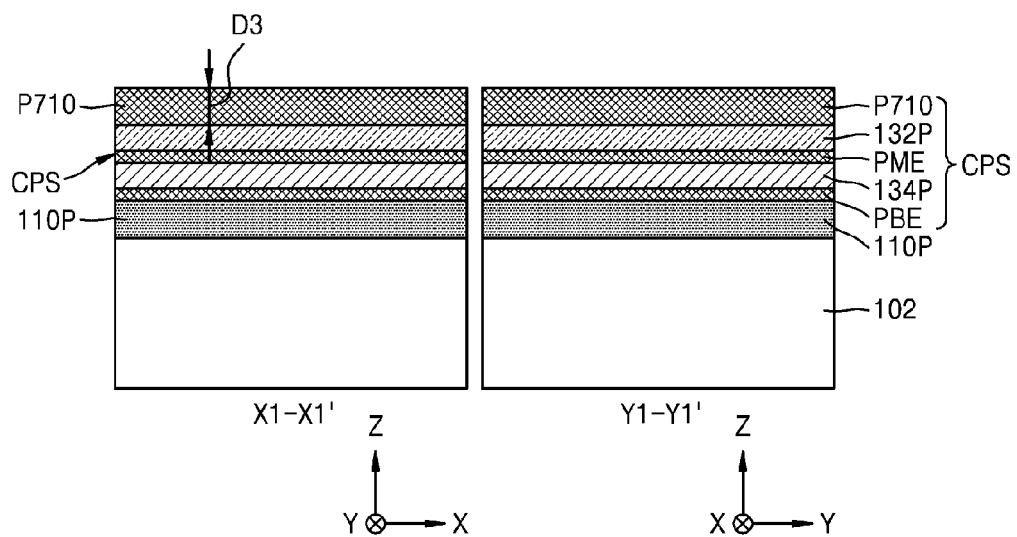
FIGS. 13A, 13B, 13C, 13D, 13E, 13F, 13G and 13H are cross-sectional views sequentially showing a method of manufacturing a resistive semiconductor device, according to other embodiments of the inventive concept, each taken in directions corresponding to directions along lines X1-X1' and Y1-Y1 of FIG. 1A.

Referring to FIG. 13A, in a manner similar to the process described with reference to FIG. 10A, the first conductive layer 110P is formed on the substrate 102, and the cross point array forming stack structure CPS is formed by sequentially stacking preliminary bottom electrode layer PBE, preliminary selection device layer 134P, preliminary middle electrode layer PME, preliminary memory layer 132P, and preliminary top electrode layer P710 on the first conductive layer 110P.

The preliminary top electrode layer P710 has generally the same structure as the preliminary top electrode layer PTE described with reference to FIG. 10A except that the thickness D3 of the preliminary top electrode layer P710 is greater than that of the preliminary top electrode layer PTE of FIG. 10A.

Figure 13B:
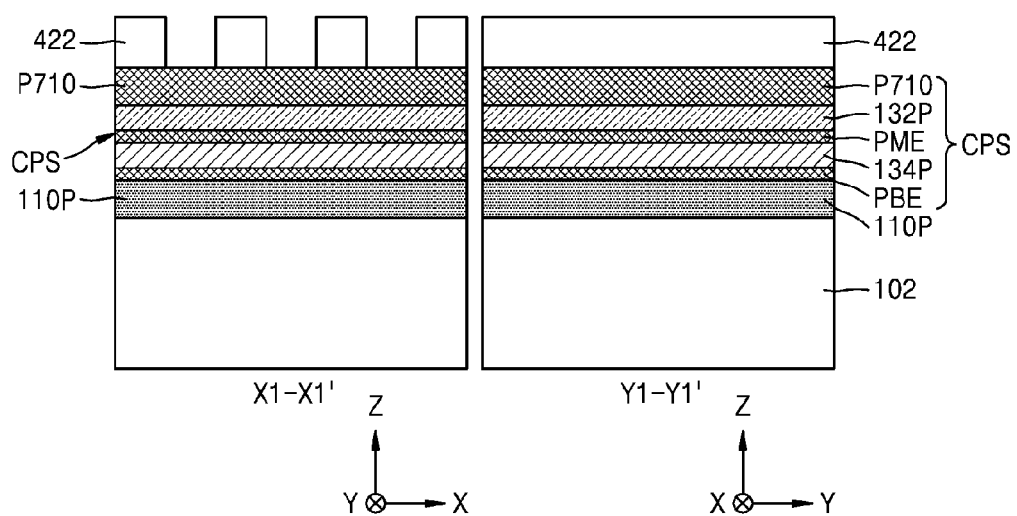

Referring to FIG. 13B, the first mask pattern 422 is formed on the preliminary top electrode layer P710.

Figure 13C:
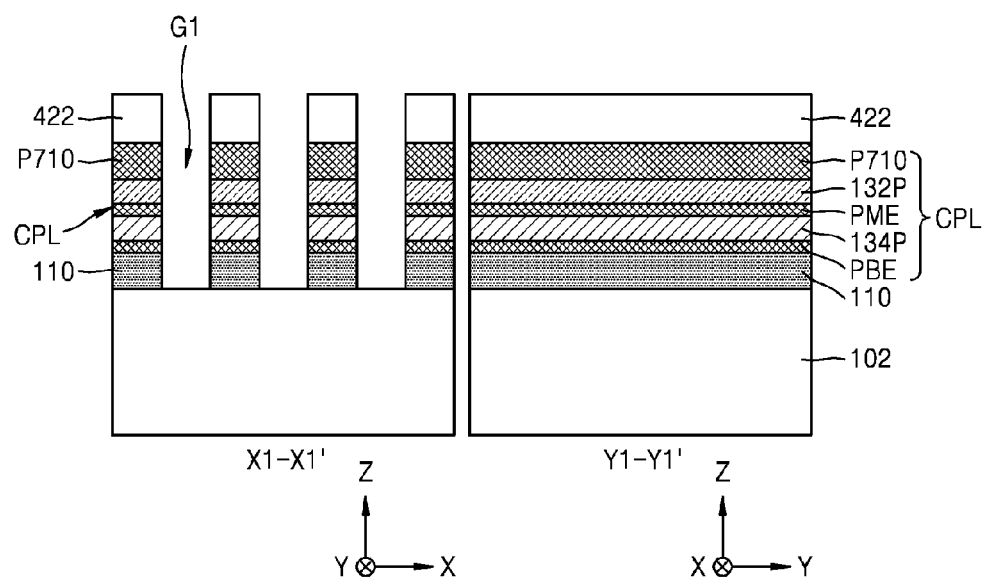

Referring to FIG. 13C, similarly to the description provided with reference to FIG. 10C, the stack structure CPS and the first conductive layer 110P may be anisotropically etched sequentially using the first mask pattern 422 as an etch mask such that the cross point array forming stack structure CPS is separated into the plurality of stack lines CPL, and the first conductive layer 110P is separated into the plurality of first conductive lines 110.

As a result, the plurality of first conductive lines 110 and the plurality of stack lines CPL may be formed extending parallel to each other in a first direction (Y direction), and the plurality of first gaps G1 may be formed between the plurality of first conductive lines 110 and between the plurality of stack lines CPL.

Figure 13D:
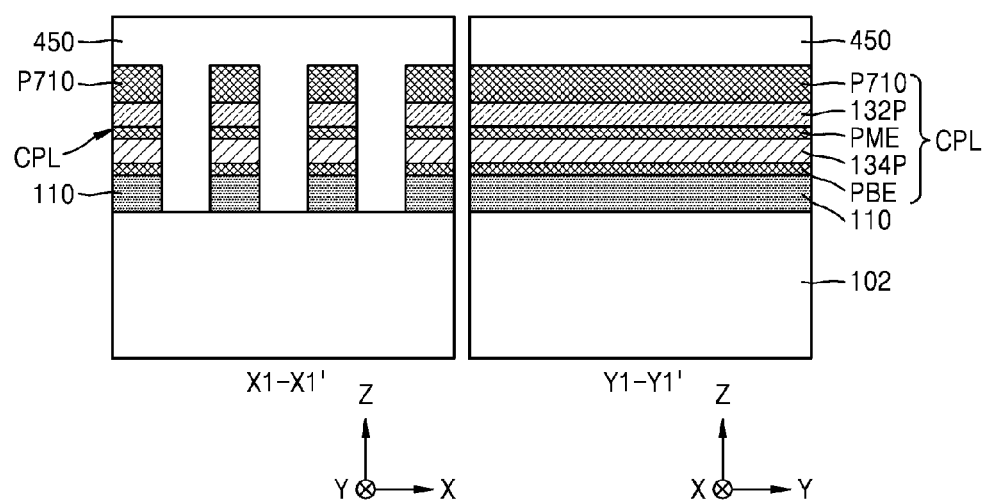

Referring to FIG. 13D, the gap-fill insulating film 450 is formed to fill the plurality of first gaps G1 and cover a top surface of the preliminary top electrode layer P710 after exposing the top surface of the preliminary top electrode layer P710 by removing the first mask pattern 422 (see FIG. 13C).

Figure 13E:
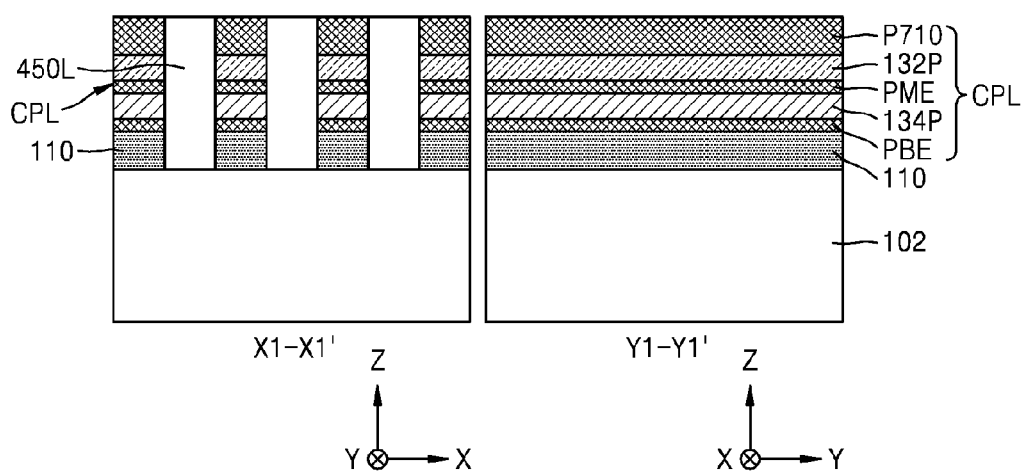

Referring to FIG. 13E, a part of the gap-fill insulating film 450 remaining on the preliminary top electrode layer P710 is removed such that the plurality of gap-fill insulating lines 450L remains in the plurality of first gaps G1.

Figure 13F:
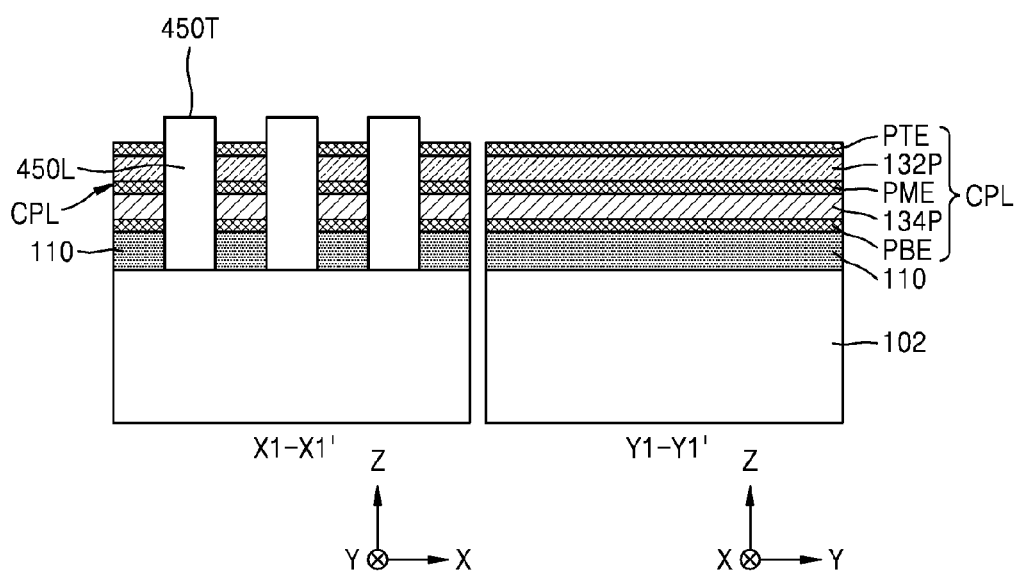

Referring to FIG. 13F, an etch selectivity between the plurality of gap-fill insulating lines 450L and the preliminary top electrode layer P710 is used to remove a predetermined thickness of a top surface of the preliminary top electrode layer P710, thereby forming the preliminary top electrode layer PTE as a remaining part of the preliminary top electrode layer P710.

As a result, the level of the top surfaces 450T of the plurality of gap-fill insulating lines 450L is higher than that of the exposed top surface of the preliminary top electrode layer PTE. Thus, part of each of the plurality of gap-fill insulating lines 450L protrudes from the structure in a direction away from the substrate 102.

Figure 13G:
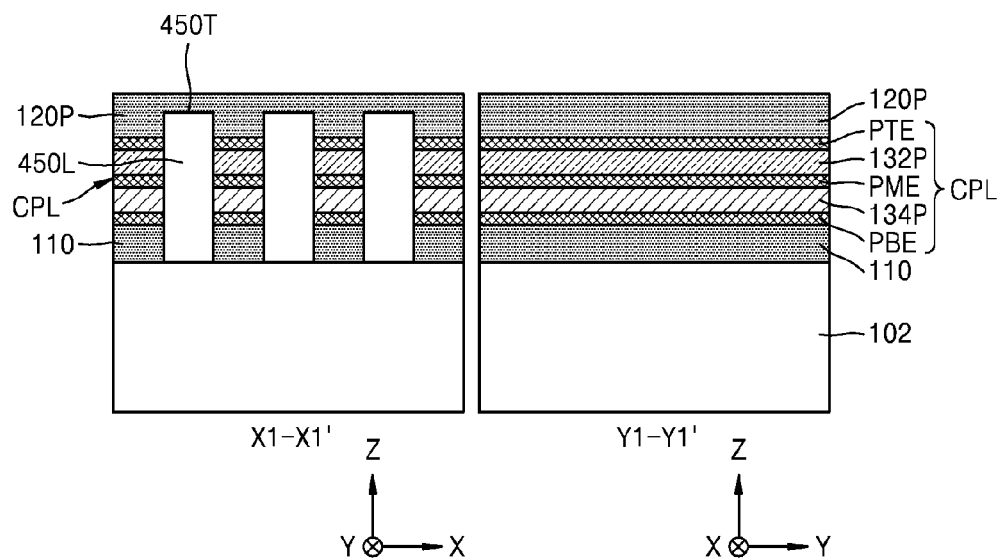

Referring to FIG. 13G, as described with reference to FIG. 10G, the second conductive layer 120P is formed on the exposed top surface of the preliminary top electrode layer PTE and the protruding top surfaces of the plurality of gap-fill insulating lines 450L.

Figure 13H:
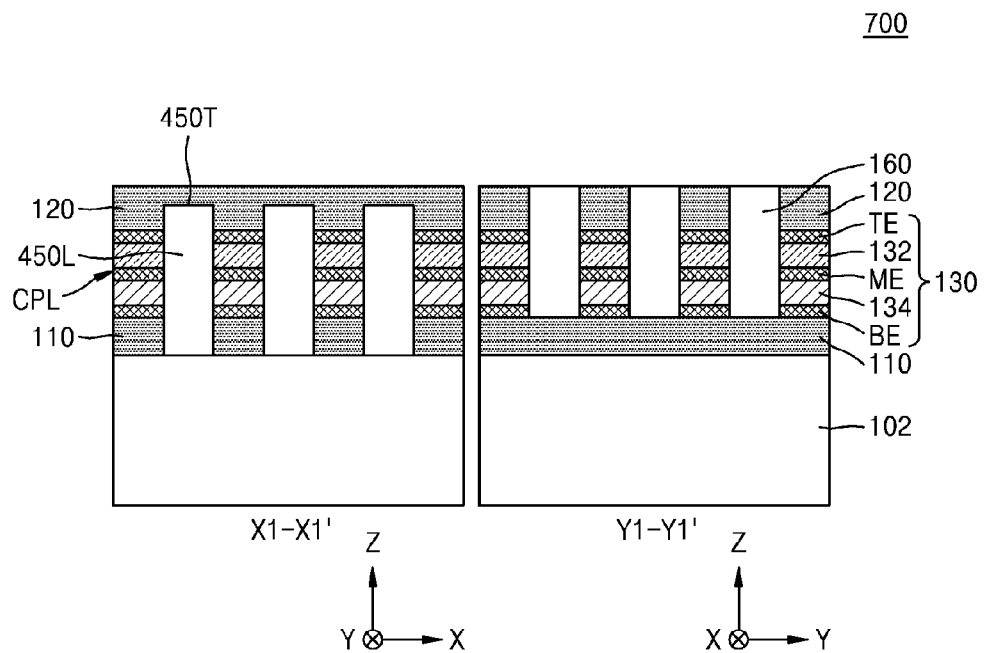

Referring to FIG. 13H, processes described with reference to FIGS. 10H through 10K are performed to separate the second conductive layer 120P into the plurality of second conductive lines 120, separate the plurality of stack lines CPL into the plurality of memory cell pillars 130, form the plurality of memory cell pillars 130 disposed at a plurality of crossing points between the plurality of first conductive lines 110 and the plurality of second conductive lines 120, and form the plurality of insulating lines 160 between the plurality of memory cell pillars 130 and the plurality of second conductive lines 120 arranged in a line in the first direction (Y direction).

Subsequently, the interlayer insulating film 470 described with reference to FIG. 10K may be formed if desired.

Although the method of manufacturing the resistive memory device 700 having a structure similar to that of the resistive memory device 100 of FIGS. 1A through 2D is described with reference to FIGS. 13A through 13H, those of ordinary skill in the art will readily understand how the method may be adapted to manufacture the resistive memory device 200 of FIGS. 5A through 5C, the resistive memory device 300 of FIG. 7, the resistive memory device 400 of FIG. 10K, the resistive memory device 500 of FIG. 11K, the resistive memory device 600 of FIG. 12E, or devices having similar structures to those of the resistive memory devices 200 through 600 with reference to FIGS. 13A through 13H within the scope of the inventive concept.

Figure 14:
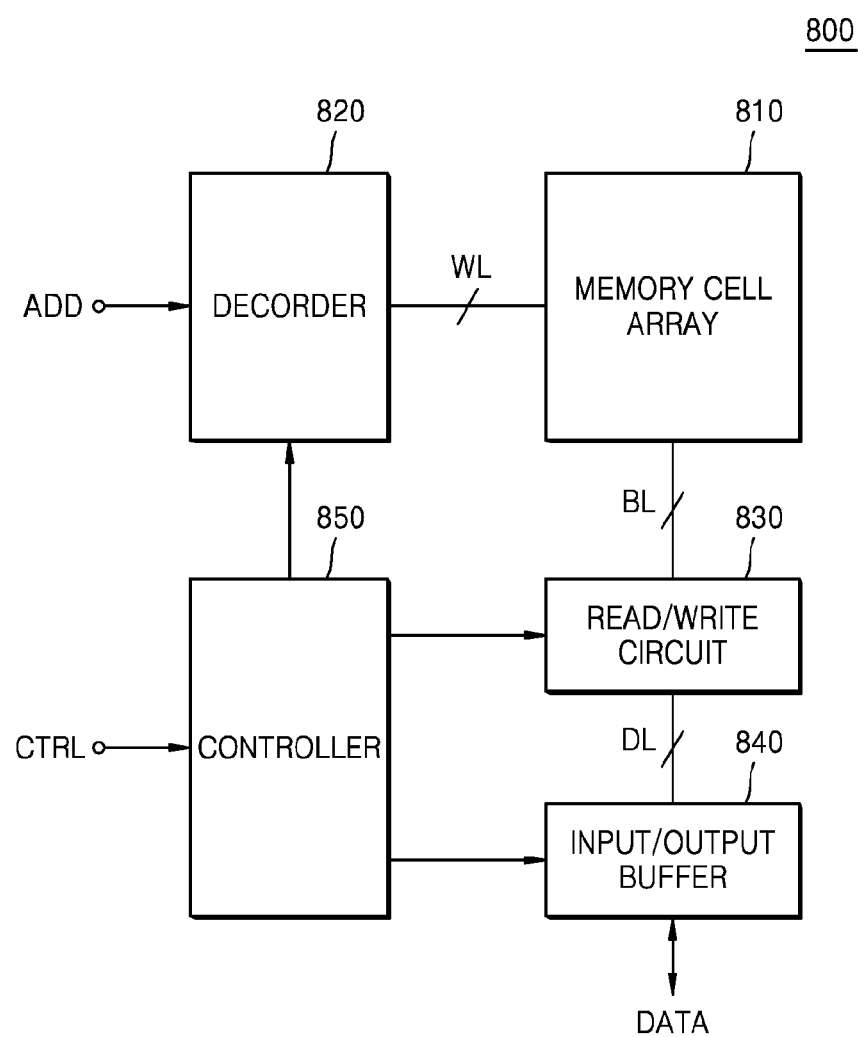
FIG. 14 is a block diagram of a memory device according to an embodiment of the inventive concept.

FIG. 14 is a block diagram of a memory device 800 according to an embodiment of the inventive concept.

More specifically, the memory device 800 according to an embodiment of the inventive concept includes a memory cell array 810, a decoder 820, a read/write circuit 830, an input/output buffer 840, and a controller 850. The memory cell array 810 includes at least one of the resistive memory device 100 of FIGS. 1A through 2D, the resistive memory device 200 of FIGS. 5A through 5C, the resistive memory device 300 of FIG. 7, the resistive memory device 400 of FIG. 10K, the resistive memory device 500 of FIG. 11K, the resistive memory device 600 of FIG. 12E, and the resistive memory device 700 of FIG. 13H.

A plurality of memory cells of the memory cell array 810 is connected to the decoder 820 through word lines WL/ and is connected to the read/write circuit 830 through bit lines BL/. The decoder 820 receives an external address ADD, and may decode a row address and a column address that are to access the memory cell array 810 under control of the controller 850 operating according to a control signal CTRL.

The read/write circuit 830 receives data DATA from the input/output buffer 840 and data lines DL/ to record the data DATA to a selected memory cell of the memory cell array 810 under control of the controller 850 or provide the data DATA read from the selected memory cell of the memory cell array 810 to the input/output buffer 840 under control of the controller 850.

Figure 15:
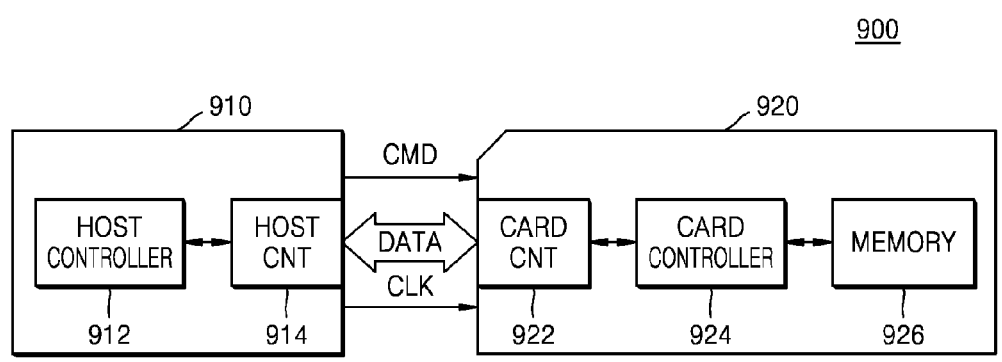
FIG. 15 is a block diagram of a memory card system including a resistive memory device, according to an embodiment of the inventive concept.

FIG. 15 is a block diagram of a memory card system 900 including a resistive memory device, according to an embodiment of the inventive concept.

Referring to FIG. 15, the memory card system 900 may include a host 910 and a memory card 920. The host 910 may include a host controller 912 and a host connection unit 914. The memory card 920 may include a card connection unit 922, a card controller 924, and a memory device 926. The memory device 926 includes at least one of the resistive memory device 100 of FIGS. 1A through 2D, the resistive memory device 200 of FIGS. 5A through 5C, the resistive memory device 300 of FIG. 7, the resistive memory device 400 of FIG. 10K, the resistive memory device 500 of FIG. 11K, the resistive memory device 600 of FIG. 12E, and the resistive memory device 700 of FIG. 13H.

The host 910 may record or read data to or from the memory card 920. The host controller 912 may transmit a command CMD, a clock signal CLK and data DATA generated by a clock generator (not shown) of the host 910 to the memory card 920 through the card connection unit 922.

The card controller 924 may store the data DATA in the memory device 926 in synchronization with the clocks signal CLK generated by the clock generator (not shown) of the card controller 924 in response to the command CMD received through the card connection unit 922. The memory device 926 may store the data DATA transmitted from the host 910.

The memory card 920 may be a compact flash card (CFC), a microdrive, a smart media card (SMC), a multimedia card (MMC), a security digital card (SDC), a memory stick (MC), a universal serial bus (USB) flash memory driver, etc.

Figure 16:
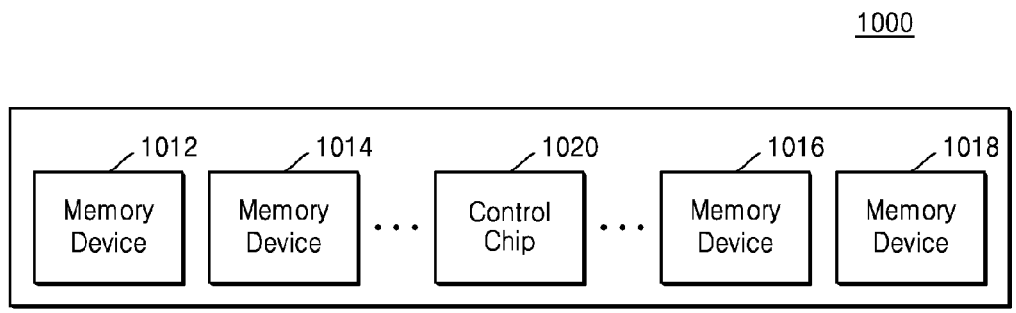
FIG. 16 is a block diagram of a resistive memory module according to an embodiment of the inventive concept.

FIG. 16 is a block diagram of a resistive memory module 1000 according to an embodiment of the inventive concept.

Referring to FIG. 16, the resistive memory module 1000 according to an embodiment of the inventive concept may include a plurality of memory devices 1012, 1014, 1016, and 1018 and a control chip 1020. Each of the plurality of memory devices 1012, 1014, 1016, and 1018 includes at least one of the resistive memory device 100 of FIGS. 1A through 2D, the resistive memory device 200 of FIGS. 5A through 5C, the resistive memory device 300 of FIG. 7, the resistive memory device 400 of FIG. 10K, the resistive memory device 500 of FIG. 11K, the resistive memory device 600 of FIG. 12E, and the resistive memory device 700 of FIG. 13H.

The control chip 1020 may control the plurality of memory devices 1012, 1014, 1016, and 1018 in response to various signals transmitted from an external memory controller. For example, the control chip 1020 may activate the plurality of memory devices 1012, 1014, 1016, and 1018 to control read and write operations according to various commands and addresses transmitted from the outside. The control chip 1020 may perform various post processing, for example, error detection and correction operations, on read data output from each of the plurality of memory devices 1012, 1014, 1016, and 1018.

Figure 17:
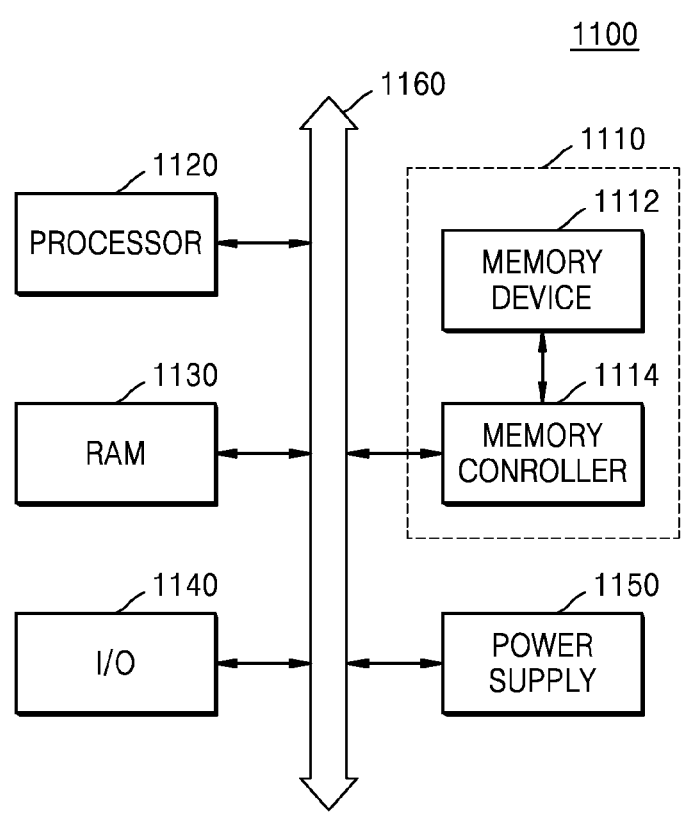
FIG. 17 is a block diagram of a computing system including a resistive memory device according to an embodiment of the inventive concept.

FIG. 17 is a block diagram of a computing system 1100 including a resistive memory device according to an embodiment of the inventive concept.

Referring to FIG. 17, the computing system 1100 may include a memory system 1110, a processor 1120, a random access memory (RAM) 1130, an input/output (I/O) device 1140, and a power supply device 1150. The memory system 1110 may include a memory device 1111 and a memory controller 1122. Although not shown in FIG. 17, the computing system 1100 may further include ports which are capable of communicating with a video card, a sound card, a memory card, a USB device or other electronic devices. The computing system 1100 may be that of a personal computer or a portable electronic device such as a notebook computer, a mobile phone, a personal digital assistant (PDA) or a camera.

The processor 1120 may execute specific calculations or specific tasks. In some embodiments, the processor 1120 may be a micro-processor or a central processing unit (CPU). The processor 1120 may communicate with the RAM 1130, the I/O device 1140 and the memory system 1110 through a bus 1160 such as an address bus, a control bus or a data bus. In this regard, the memory system 1110 and/or the RAM 1130 includes at least one of the resistive memory device 100 of FIGS. 1A through 2D, the resistive memory device 200 of FIGS. 5A through 5C, the resistive memory device 300 of FIG. 7, the resistive memory device 400 of FIG. 10K, the resistive memory device 500 of FIG. 11K, the resistive memory device 600 of FIG. 12E, and the resistive memory device 700 of FIG. 13H.

In some embodiments, the processor 1120 may be connected to an expansion bus such as a peripheral component interconnect (PCI) bus.

The RAM 1130 may store data necessary for operations of the computing system 1100 therein. The RAM 1130 may include resistive memory devices according to the embodiments of the inventive concept, a DRAM device, a mobile DRAM device, an SRAM device, a PRAM device, an FRAM device, or an MRAM device.

The I/O device 1140 may include an input device such as a keyboard, a keypad or a mouse and an output device such as a printer or a display. The power supply device 1150 may supply a power supply voltage necessary for operations of the computing system 1100.

While the inventive concept has been particularly shown and described with reference to exemplary embodiments thereof, it will be understood that various changes in form and details may be made therein without departing from the spirit and scope of the inventive concept as set forth in the following claims.

What is claimed is:
1. A resistive memory device comprising:
a plurality of memory cell pillars spaced in a line in one direction and each comprising a memory layer, a top electrode layer electrically connected to the memory layer, and a selection device;
bottom conductive lines each extending in another direction crossing said one direction;
a top conductive line having protrusions at its bottom and pockets in its bottom,
wherein the bottom conductive lines are electrically connected to the memory cell pillars at first parts of the bottom conductive lines, respectively,
the selection device of each of the memory cell pillars is interposed between the memory layer of the memory cell pillar and a respective one of the bottom conductive lines,
the pockets are defined by and between the protrusions in said one direction such that the pockets and protrusions are alternately disposed along said one direction, whereby the top conductive line has an uneven bottom surface,
the protrusions are connected to the memory cell pillars at tops of the memory cell pillars, respectively, and
each of the protrusions is electrically connected to the memory layer of a respective one of the memory cell pillars through the top electrode layer of the memory cell pillar; and
a plurality of insulating pillars occupying insulating spaces defined by side surfaces of the memory layer and top electrode layer, the insulating pillars extending into the pockets in the bottom of the top conductive line, respectively.
2. The resistive memory device of claim 1, wherein the insulating pillars contact said side surfaces of the memory layer and top electrode layer.

3. The resistive memory device of claim 1, wherein the selection device of each of the memory cell pillars is a diode.

4. The resistive memory device of claim 1, wherein the selection device of each of the memory cell pillars comprises:
a selection device layer;
a middle electrode layer interposed between the selection device layer and the memory layer; and
a bottom electrode layer spaced apart from the middle electrode layer, and wherein the selection device layer is interposed between the bottom electrode layer and the middle electrode layer.

5. The resistive memory device of claim 1,
wherein the top conductive line is one of a word line and a bit line, and
each of the bottom conductive lines is the other of a word line and a bit line.

6. The resistive memory device of claim 1, wherein the memory layer is a variable resistance layer that can assume different states in which the resistances of the variable resistance layer are different from one another.

7. The resistive memory device of claim 1, wherein the memory layer comprises at least one transition metal oxide.

8. A resistive memory device comprising:
a substrate;
a top conductive line extending in a lengthwise direction over the substrate;
memory cell pillars interposed between the substrate and the top conductive line; and
interlayer insulation between the substrate and the top conductive line and electrically insulating the memory cell pillars from one another in a region of the device between the substrate and the top conductive line,
wherein the top conductive line has downwardly extending protrusions spaced from each other in the lengthwise direction, and a downwardly open pocket delimited by and between the protrusions,
the memory cell pillars are spaced from each other in the lengthwise direction, are vertically aligned with the protrusions of the top conductive line, respectively,
each of the memory cell pillars comprises a variable resistor and a top electrode interposed between the variable resistor and a respective one of the downwardly extending protrusions of the top conductive line,
the variable resistor and the top electrode of each of the memory cell pillars have the same footprints as one another and as the protrusion with which the memory cell pillar is vertically aligned, and
the interlayer insulation extends around the variable resistor and the top electrode of each of the memory cell pillars and into the pocket in the top conductive line such that the interlayer insulation projects from a location between the memory cell pillars upwardly beyond the level of an uppermost surface of the top electrode of each of the memory cell pillars.

9. The resistive memory device of claim 8, further comprising:
bottom conductive lines interposed between the substrate and the memory cell pillars, respectively,
wherein the bottom conductive lines extend parallel to each other in a direction that crosses the lengthwise direction of the top conductive line, and
each of the memory cell pillars has a bottom surface that contacts a respective one of the bottom conductive lines, that has the same width in the lengthwise direction of the top conductive line as said respective one of the bottom conductive lines, and that has the same footprint as the variable resistor and top electrode of the memory cell pillar.

10. The resistive memory device of claim 9,
wherein the top conductive line is one of a word line and a bit line, and
each of the bottom conductive lines is the other of a word line and a bit line.

11. The resistive memory device of claim 8, wherein the interlayer insulation comprises insulating material contacting sides of the variable resistor and top electrode.

12. The resistive memory device of claim 8, wherein each of the memory cell pillars further comprises a diode, and
the diode, the variable resistor, and the top electrode of each of the memory cell pillars have the same footprints as one another and as the protrusion with which the memory cell pillar is vertically aligned.

13. A resistive memory device comprising:
a substrate;
a top conductive line extending in a lengthwise direction over the substrate;
memory cell pillars interposed between the substrate and the top conductive line; and
interlayer insulation between the substrate and the top conductive line and electrically insulating the memory cell pillars from one another in a region of the device between the substrate and the top conductive line,
wherein the top conductive line has downwardly extending protrusions spaced from each other in the lengthwise direction, and a downwardly open pocket delimited by and between the protrusions,
the memory cell pillars are spaced from each other in the lengthwise direction, are vertically aligned with the protrusions of the top conductive line, respectively,
each of the memory cell pillars comprises a variable resistor and a top electrode interposed between the variable resistor and a respective one of the downwardly extending protrusions of the top conductive line,
the interlayer insulation extends around the variable resistor and the top electrode of each of the memory cell pillars and into the pocket in the top conductive line such that the interlayer insulation projects from a location between the memory cell pillars upwardly beyond the level of an uppermost surface of the top electrode of each of the memory cell pillars, and
the interlayer insulation includes free space in the device between the substrate and the top conductive line.

* * * * *